(12) United States Patent
Edwards et al.

(10) Patent No.: US 10,305,453 B2
(45) Date of Patent: May 28, 2019

(54) ELECTRONIC DEVICE ANTENNAS HAVING MULTIPLE OPERATING MODES

(71) Applicant: Apple Inc., Cupertino, CA (US)

(72) Inventors: Jennifer M. Edwards, San Francisco, CA (US); Yijun Zhou, Mountain View, CA (US); Yiren Wang, Santa Clara, CA (US); Hao Xu, Cupertino, CA (US); Ming-Ju Tsai, Sunnyvale, CA (US); Victor C. Lee, Sunnyvale, CA (US); Liang Han, Sunnyvale, CA (US); Matthew A. Mow, Los Altos, CA (US); Mattia Pascolini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 79 days.

(21) Appl. No.: 15/700,580

(22) Filed: Sep. 11, 2017

(65) Prior Publication Data

US 2019/0081615 A1 Mar. 14, 2019

(51) Int. Cl.
*H03J 1/00* (2006.01)
*H03J 7/18* (2006.01)
*H04B 7/12* (2006.01)

(52) U.S. Cl.
CPC ............ *H03J 1/0083* (2013.01); *H03J 7/186* (2013.01); *H03J 2200/01* (2013.01); *H03J 2200/06* (2013.01)

(58) Field of Classification Search
CPC ...... H03J 1/0083; H03J 7/186; H03J 2200/01; H03J 2200/06

(Continued)

(56) References Cited

U.S. PATENT DOCUMENTS 4,984,296 A * 1/1991 Schotz .................. H04B 1/18
343/715
5,768,691 A * 6/1998 Matero .................. H01Q 1/24
333/101

(Continued)

FOREIGN PATENT DOCUMENTS

WO 03096474 A1 11/2003

OTHER PUBLICATIONS

Petosa, "An Overview of Tuning Techniques for Frequency-Agile Antennas", IEEE Antennas and Propagation Magazine 545 (2012): 271-296.

(Continued)

*Primary Examiner* — Hai V Nguyen
(74) *Attorney, Agent, or Firm* — Treyz Law Group, P.C.; Joseph F. Guihan

(57) ABSTRACT

An electronic device may be provided with wireless circuitry and control circuitry. The wireless circuitry may include an antenna with an inverted-F antenna resonating element formed from portions of a peripheral conductive electronic device housing structure and may have an antenna ground that is separated from the antenna resonating element by a gap. The antenna may include a first adjustable component coupled between the antenna resonating element arm and the antenna ground on a first side of the antenna feed and a second adjustable component coupled between the antenna resonating element arm and the antenna ground on a second side of the antenna feed. Control circuitry in the electronic device may adjust the first and second adjustable components between a first tuning mode, a second tuning mode, and a third tuning mode.

20 Claims, 11 Drawing Sheets

(58) Field of Classification Search
USPC .................................. 455/77; 333/17.1, 17.3
See application file for complete search history.

(56) References Cited

U.S. PATENT DOCUMENTS

| | | | | |
|---|---|---|---|---|
| 6,147,647 | A * | 11/2000 | Tassoudji | H01Q 9/0492 333/219.1 |
| 6,344,833 | B1 * | 2/2002 | Lin | H01Q 1/40 343/785 |
| 7,146,139 | B2 * | 12/2006 | Nevermann | H04B 1/3838 455/115.1 |
| 7,274,334 | B2 * | 9/2007 | O'Riordan | H01Q 1/243 343/700 MS |
| 7,403,756 | B1 * | 7/2008 | Jiacinto | H04B 1/0007 455/191.1 |
| 7,627,297 | B2 * | 12/2009 | Nam | H03J 1/0083 455/132 |
| 7,701,407 | B2 * | 4/2010 | Kanno | H01Q 13/106 343/767 |
| 7,916,090 | B2 * | 3/2011 | Nysen | H01Q 1/2275 343/702 |
| 7,952,528 | B2 * | 5/2011 | Nysen | H01Q 1/2275 343/700 MS |
| 8,049,671 | B2 * | 11/2011 | Nysen | H01Q 1/2275 343/727 |
| 8,059,046 | B2 * | 11/2011 | Nysen | H01Q 1/2275 343/702 |
| 8,131,232 | B2 * | 3/2012 | Muhammad | H04B 1/0458 330/86 |
| 8,406,831 | B2 * | 3/2013 | Yang | H01Q 1/243 343/702 |
| 8,473,017 | B2 * | 6/2013 | Milosavljevic | H01Q 1/241 343/702 |
| 8,594,584 | B2 * | 11/2013 | Greene | H04B 1/0458 455/77 |
| 8,682,260 | B1 * | 3/2014 | Granger-Jones | H04B 1/0475 455/339 |
| 8,725,098 | B2 * | 5/2014 | Shana'a | H03H 7/40 455/136 |
| 8,836,587 | B2 * | 9/2014 | Darnell | H01Q 1/243 343/700 MS |
| 8,957,827 | B1 * | 2/2015 | Lee | H01Q 5/321 343/700 MS |
| 9,024,823 | B2 * | 5/2015 | Bevelacqua | H01Q 9/42 343/702 |
| 9,035,833 | B2 * | 5/2015 | Zhang | H01Q 1/243 343/702 |
| 9,077,066 | B1 * | 7/2015 | Lee | H01Q 9/0407 |
| 9,118,304 | B2 * | 8/2015 | Bingham | H03J 5/00 |
| 9,130,279 | B1 * | 9/2015 | Lee | H01Q 1/50 |
| 9,166,279 | B2 * | 10/2015 | Jin | H01Q 1/243 |
| 9,325,066 | B2 * | 4/2016 | Wong | H01Q 5/328 |
| 9,325,076 | B2 * | 4/2016 | Bishop | H01Q 15/0086 |
| 9,325,080 | B2 * | 4/2016 | Ouyang | H01Q 21/30 |
| 9,401,544 | B2 * | 7/2016 | Zhang | H01Q 1/243 |
| 9,548,535 | B1 * | 1/2017 | Kuo | H01Q 3/34 |
| 9,577,332 | B2 * | 2/2017 | Chen | H01Q 1/243 |
| 9,584,091 | B2 * | 2/2017 | Peng | H03H 7/40 |
| 9,653,821 | B1 * | 5/2017 | Obeidat | H01Q 21/30 |
| 9,876,272 | B2 * | 1/2018 | Hu | H01Q 1/243 |
| 9,905,910 | B2 * | 2/2018 | Chen | H01Q 1/243 |
| 9,966,667 | B2 * | 5/2018 | Ayala Vazquez | H01Q 13/103 |
| 9,972,908 | B2 * | 5/2018 | Sanchez | H01Q 5/328 |
| 9,997,828 | B2 * | 6/2018 | Ouyang | H01Q 21/30 |
| 10,056,695 | B2 * | 8/2018 | Ayala Vazquez | H01Q 1/245 |
| 10,141,655 | B2 * | 11/2018 | Desclos | H01Q 21/006 |
| 2001/0050640 | A1 * | 12/2001 | Apostolos | H01Q 1/242 343/700 MS |
| 2002/0119759 | A1 * | 8/2002 | Hahn | H03B 19/14 455/77 |
| 2002/0183013 | A1 * | 12/2002 | Auckland | H01Q 1/243 455/73 |
| 2004/0227679 | A1 * | 11/2004 | Lu | H01Q 1/243 343/702 |
| 2005/0085204 | A1 * | 4/2005 | Poilasne | G01R 27/2694 455/193.1 |
| 2006/0214850 | A1 * | 9/2006 | O'Riordan | H01Q 1/243 343/700 MS |
| 2008/0122711 | A1 * | 5/2008 | Kimura | H01Q 1/273 343/745 |
| 2008/0266199 | A1 * | 10/2008 | Milosavljevic | H01Q 1/241 343/850 |
| 2008/0284670 | A1 * | 11/2008 | Kanno | H01Q 13/106 343/767 |
| 2009/0115670 | A1 * | 5/2009 | Nysen | H01Q 1/2275 343/702 |
| 2009/0115672 | A1 * | 5/2009 | Nysen | H01Q 1/2275 343/730 |
| 2009/0115673 | A1 * | 5/2009 | Nysen | H01Q 1/2275 343/730 |
| 2009/0121947 | A1 * | 5/2009 | Nysen | H01Q 1/2275 343/702 |
| 2009/0121948 | A1 * | 5/2009 | Nysen | H01Q 1/2275 343/702 |
| 2009/0122847 | A1 * | 5/2009 | Nysen | H01Q 1/38 375/222 |
| 2009/0124215 | A1 * | 5/2009 | Nysen | H01Q 1/2275 455/90.1 |
| 2009/0135087 | A1 * | 5/2009 | Gummalla | H01P 3/02 343/909 |
| 2010/0123635 | A1 * | 5/2010 | Lopez | H01Q 1/38 343/722 |
| 2010/0248649 | A1 * | 9/2010 | White | H03J 3/20 455/77 |
| 2011/0001672 | A1 * | 1/2011 | Harihara | H01Q 1/2283 343/702 |
| 2011/0086600 | A1 * | 4/2011 | Muhammad | H04B 1/0458 455/120 |
| 2011/0136458 | A1 * | 6/2011 | Seo | H01Q 1/243 455/269 |
| 2011/0175789 | A1 * | 7/2011 | Lee | H01Q 1/243 343/853 |
| 2011/0241797 | A1 * | 10/2011 | Shana'a | H03H 7/40 333/174 |
| 2012/0009983 | A1 * | 1/2012 | Mow | H01Q 1/243 455/575.7 |
| 2012/0169547 | A1 * | 7/2012 | Oh | H01Q 1/44 343/702 |
| 2012/0231750 | A1 * | 9/2012 | Jin | H01Q 7/005 455/77 |
| 2012/0295555 | A1 * | 11/2012 | Greene | H04B 1/0458 455/77 |
| 2013/0122831 | A1 * | 5/2013 | Desclos | H04B 1/44 455/78 |
| 2013/0135155 | A1 * | 5/2013 | Zhang | H01Q 1/243 343/700 MS |
| 2013/0137383 | A1 * | 5/2013 | Kobayashi | H03F 1/34 455/77 |
| 2013/0194133 | A1 * | 8/2013 | Desclos | H01Q 1/242 342/357.75 |
| 2013/0203364 | A1 * | 8/2013 | Darnell | H01Q 1/243 455/77 |
| 2013/0208631 | A1 * | 8/2013 | Dufrene | H04B 1/1036 370/277 |
| 2013/0217342 | A1 * | 8/2013 | Abdul-Gaffoor | H03K 17/955 455/77 |
| 2013/0241800 | A1 * | 9/2013 | Schlub | H01Q 1/243 343/893 |
| 2013/0271330 | A1 * | 10/2013 | Bishop | H01Q 15/0086 343/745 |
| 2013/0335280 | A1 * | 12/2013 | Chen, III | H01Q 21/28 343/725 |
| 2014/0038535 | A1 * | 2/2014 | Bingham | H03J 5/00 455/150.1 |
| 2014/0057578 | A1 * | 2/2014 | Chan | H04B 1/006 455/77 |
| 2014/0085159 | A1 * | 3/2014 | Wong | H01Q 5/328 343/843 |
| 2014/0206297 | A1 * | 7/2014 | Schlub | H01Q 1/243 455/77 |

(56) References Cited

U.S. PATENT DOCUMENTS

| | | | |
|---|---|---|---|
| 2014/0266941 A1* | 9/2014 | Vazquez | H01Q 13/103 343/746 |
| 2014/0333495 A1* | 11/2014 | Vazquez | H01Q 9/06 343/745 |
| 2014/0370824 A1* | 12/2014 | Larsen | H04B 7/12 455/77 |
| 2014/0378074 A1* | 12/2014 | Yang | H04B 1/006 455/77 |
| 2015/0038094 A1* | 2/2015 | Maxim | H03F 3/193 455/77 |
| 2015/0130661 A1* | 5/2015 | Desclos | G01S 19/36 342/352 |
| 2015/0147980 A1* | 5/2015 | Larsen | H01Q 5/314 455/77 |
| 2015/0162662 A1* | 6/2015 | Chen | H01Q 23/00 343/876 |
| 2015/0188595 A1* | 7/2015 | Black | H03H 7/0153 455/77 |
| 2015/0200458 A1* | 7/2015 | Peng | H01Q 5/335 455/77 |
| 2015/0249292 A1* | 9/2015 | Ouyang | H01Q 21/30 343/702 |
| 2015/0249479 A1* | 9/2015 | Nobbe | H04B 17/12 455/77 |
| 2015/0255869 A1* | 9/2015 | Sorensen | H01Q 7/005 455/77 |
| 2015/0263420 A1* | 9/2015 | Wu | H01Q 1/523 455/78 |
| 2015/0270613 A1* | 9/2015 | Toh | H01Q 9/0442 343/876 |
| 2015/0280771 A1* | 10/2015 | Mow | H01Q 1/243 455/77 |
| 2015/0340769 A1* | 11/2015 | Desclos | H01Q 21/0006 343/745 |
| 2015/0365073 A1* | 12/2015 | Hallivuori | H03J 3/20 334/30 |
| 2016/0057486 A1* | 2/2016 | Bingham | H03J 5/00 348/731 |
| 2016/0064801 A1* | 3/2016 | Han | H01Q 1/243 343/702 |
| 2016/0105212 A1* | 4/2016 | Boire | H01Q 21/0006 455/77 |
| 2016/0174197 A1* | 6/2016 | Oon | H01Q 1/243 455/77 |
| 2016/0197401 A1* | 7/2016 | Ouyang | H01Q 21/30 343/724 |
| 2016/0308271 A1* | 10/2016 | Jin | H01Q 1/243 |
| 2016/0352014 A1* | 12/2016 | Chen | H01Q 1/243 |
| 2017/0033460 A1* | 2/2017 | Ayala Vazquez | H01Q 13/103 |
| 2017/0054196 A1* | 2/2017 | Hu | H01Q 1/243 |
| 2017/0084989 A1* | 3/2017 | Shi | H01Q 1/245 |
| 2017/0141468 A1* | 5/2017 | Hu | H01Q 1/243 |
| 2018/0048057 A1* | 2/2018 | Ehman | H04B 5/0012 |
| 2018/0048058 A1* | 2/2018 | Ehman | H01Q 1/2291 |
| 2018/0069317 A1* | 3/2018 | Ayala Vazquez | H01Q 13/103 |
| 2018/0083344 A1* | 3/2018 | Han | H01Q 1/243 |
| 2018/0090816 A1* | 3/2018 | Mow | H01Q 1/243 |
| 2018/0090826 A1* | 3/2018 | Da Costa Bras Lima | H01Q 1/273 |
| 2018/0090847 A1* | 3/2018 | Romano | H01Q 13/10 |
| 2018/0115053 A1* | 4/2018 | Hu | H01Q 1/243 |
| 2018/0219276 A1* | 8/2018 | Han | H01Q 1/243 |
| 2018/0323513 A1* | 11/2018 | Varnoosfaderani | H01Q 21/062 |
| 2018/0342789 A1* | 11/2018 | Jiang | H01Q 1/243 |
| 2018/0342794 A1* | 11/2018 | Han | H01Q 1/245 |
| 2018/0351244 A1* | 12/2018 | McAuliffe | H01Q 1/44 |

OTHER PUBLICATIONS

Han et al., U.S. Appl. No. 15/602,972, filed May 23, 2017.

* cited by examiner

ELECTRONIC DEVICE ANTENNAS HAVING MULTIPLE OPERATING MODES

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It can be challenging to form electronic device antenna structures with desired attributes. In some wireless devices, antennas are bulky. In other devices, antennas are compact, but are sensitive to the position of the antennas relative to external objects. If care is not taken, antennas may become detuned, may emit wireless signals with a power that is more or less than desired, or may otherwise not perform as expected.

It would therefore be desirable to be able to provide improved wireless circuitry for electronic devices.

SUMMARY

An electronic device may be provided with wireless circuitry and control circuitry. The wireless circuitry may include multiple antennas and transceiver circuitry. The antennas may include antenna structures at opposing first and second ends of the electronic device. The antenna structures at a given end of the device may include adjustable components that are adjusted by the control circuitry to place the antenna structures and the electronic device in one of a number of different operating modes or states.

The antenna may have an inverted-F antenna resonating element formed from portions of a peripheral conductive electronic device housing structure and may have an antenna ground that is separated from the antenna resonating element by a gap. A short circuit path may bridge the gap. An antenna feed may be coupled across the gap in parallel with the short circuit path.

The antenna may include a first adjustable component coupled between the antenna resonating element arm and the antenna ground on a first side of the antenna feed and a second adjustable component coupled between the antenna resonating element arm and the antenna ground on a second side of the antenna feed. Control circuitry in the electronic device may adjust the first and second adjustable components between a first tuning mode, a second tuning mode, and a third tuning mode.

In the first tuning mode, the first adjustable component may form an open circuit between the antenna resonating element arm and the antenna ground whereas the second adjustable component may electrically couple the antenna resonating element arm to the antenna ground. In the second tuning mode, the second adjustable component may form an open circuit between the antenna resonating element arm and the antenna ground whereas the first adjustable component may electrically couple the antenna resonating element arm to the antenna ground. In the third tuning mode, both the first and second adjustable components may electrically couple the antenna resonating element arm to the antenna ground.

In the first tuning mode, the antenna may be configured to operate with a relatively high antenna efficiency if the device is being held by a user's right hand, whereas in the second tuning mode the antenna may be configured to operate with a relatively high antenna efficiency if the device is being held by a user's left hand. In the third tuning mode, the antenna may be configured to operate with a relatively high efficiency regardless of which hand a user is using to hold the device.

DETAILED DESCRIPTION

Figure 1:
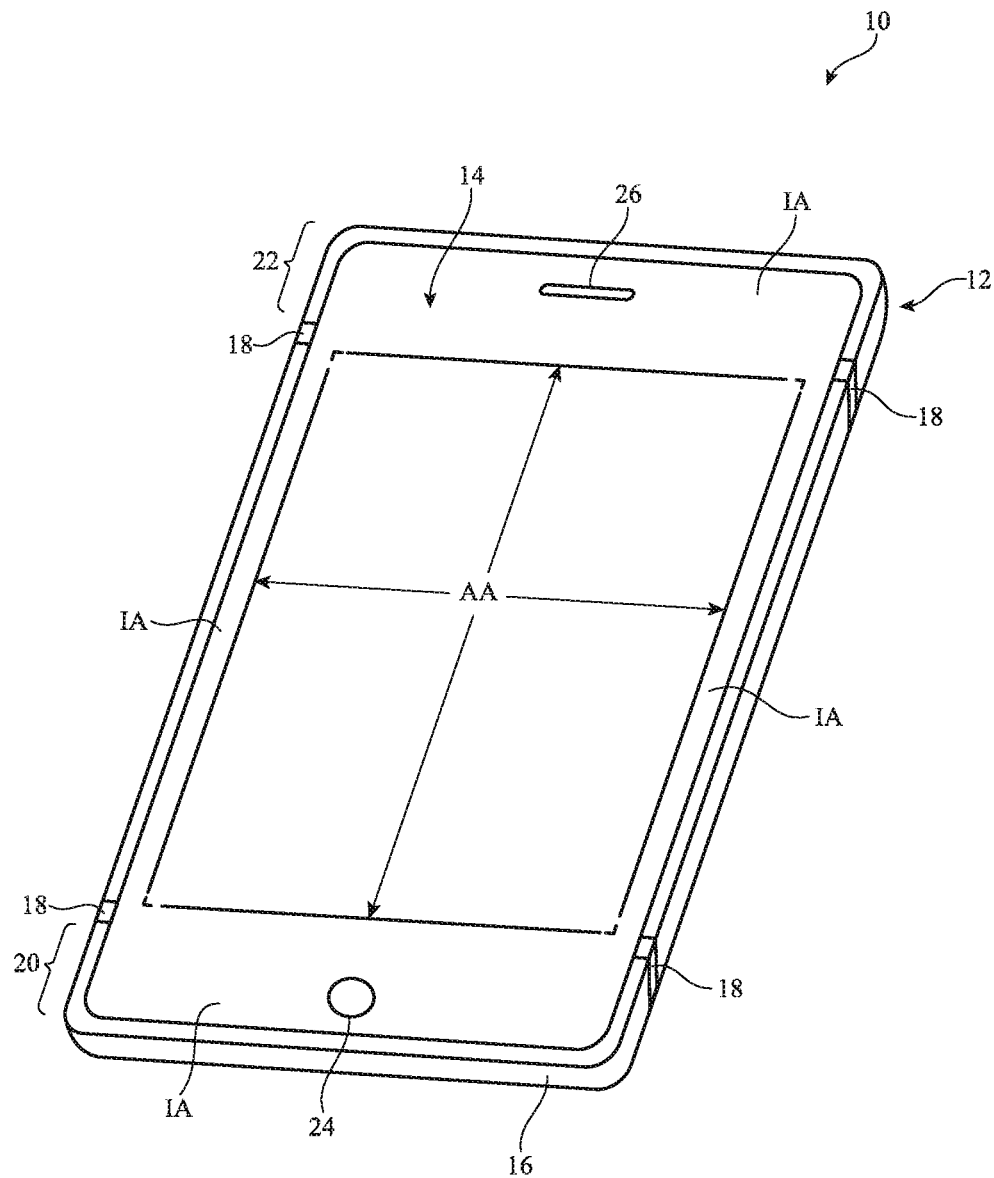
FIG. 1 is a perspective view of an illustrative electronic device in accordance with an embodiment.

Electronic devices such as electronic device 10 of FIG. 1 may be provided with wireless communications circuitry. The wireless communications circuitry may be used to support wireless communications in multiple wireless communications bands.

The wireless communications circuitry may include one more antennas. The antennas of the wireless communications circuitry can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures.

The conductive electronic device structures may include conductive housing structures. The housing structures may include peripheral structures such as peripheral conductive structures that run around the periphery of an electronic device. The peripheral conductive structures may serve as a bezel for a planar structure such as a display, may serve as sidewall structures for a device housing, may have portions that extend upwards from an integral planar rear housing (e.g., to form vertical planar sidewalls or curved sidewalls), and/or may form other housing structures.

Gaps may be formed in the peripheral conductive structures that divide the peripheral conductive structures into peripheral segments. One or more of the segments may be used in forming one or more antennas for electronic device 10. Antennas may also be formed using an antenna ground plane and/or an antenna resonating element formed from conductive housing structures (e.g., internal and/or external structures, support plate structures, etc.).

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a planar housing wall. The rear housing wall may have slots that pass entirely through the rear housing wall and that therefore separate housing wall portions (and/or sidewall portions) of housing 12 from each other. The rear housing wall may include conductive portions and/or dielectric portions. If desired, the rear housing wall may include a planar metal layer covered by a thin layer or coating of dielectric such as glass, plastic, sapphire, or ceramic. Housing 12 (e.g., the rear housing wall, sidewalls, etc.) may also have shallow grooves that do not pass entirely through housing 12. The slots and grooves may be filled with plastic or other dielectric. If desired, portions of housing 12 that have been separated from each other (e.g., by a through slot) may be joined by internal conductive structures (e.g., sheet metal or other metal members that bridge the slot).

Display 14 may include pixels formed from light-emitting diodes (LEDs), organic LEDs (OLEDs), plasma cells, electrowetting pixels, electrophoretic pixels, liquid crystal display (LCD) components, or other suitable pixel structures. A display cover layer such as a layer of clear glass or plastic may cover the surface of display 14 or the outermost layer of display 14 may be formed from a color filter layer, thin-film transistor layer, or other display layer. Buttons such as button 24 may pass through openings in the cover layer if desired. The cover layer may also have other openings such as an opening for speaker port 26.

Housing 12 may include peripheral housing structures such as structures 16. Structures 16 may run around the periphery of device 10 and display 14. In configurations in which device 10 and display 14 have a rectangular shape with four edges, structures 16 may be implemented using peripheral housing structures that have a rectangular ring shape with four corresponding edges (as an example). Peripheral structures 16 or part of peripheral structures 16 may serve as a bezel for display 14 (e.g., a cosmetic trim that surrounds all four sides of display 14 and/or that helps hold display 14 to device 10). Peripheral structures 16 may, if desired, form sidewall structures for device 10 (e.g., by forming a metal band with vertical sidewalls, curved sidewalls, etc.).

Peripheral housing structures 16 may be formed of a conductive material such as metal and may therefore sometimes be referred to as peripheral conductive housing structures, conductive housing structures, peripheral metal structures, or a peripheral conductive housing member (as examples). Peripheral housing structures 16 may be formed from a metal such as stainless steel, aluminum, or other suitable materials. One, two, or more than two separate structures may be used in forming peripheral housing structures 16.

It is not necessary for peripheral housing structures 16 to have a uniform cross-section. For example, the top portion of peripheral housing structures 16 may, if desired, have an inwardly protruding lip that helps hold display 14 in place. The bottom portion of peripheral housing structures 16 may also have an enlarged lip (e.g., in the plane of the rear surface of device 10). Peripheral housing structures 16 may have substantially straight vertical sidewalls, may have sidewalls that are curved, or may have other suitable shapes. In some configurations (e.g., when peripheral housing structures 16 serve as a bezel for display 14), peripheral housing structures 16 may run around the lip of housing 12 (i.e., peripheral housing structures 16 may cover only the edge of housing 12 that surrounds display 14 and not the rest of the sidewalls of housing 12).

If desired, housing 12 may have a conductive rear surface or wall. For example, housing 12 may be formed from a metal such as stainless steel or aluminum. The rear surface of housing 12 may lie in a plane that is parallel to display 14. In configurations for device 10 in which the rear surface of housing 12 is formed from metal, it may be desirable to form parts of peripheral conductive housing structures 16 as integral portions of the housing structures forming the rear surface of housing 12. For example, a rear housing wall of device 10 may be formed from a planar metal structure and portions of peripheral housing structures 16 on the sides of housing 12 may be formed as flat or curved vertically extending integral metal portions of the planar metal structure. Housing structures such as these may, if desired, be machined from a block of metal and/or may include multiple metal pieces that are assembled together to form housing 12. The planar rear wall of housing 12 may have one or more, two or more, or three or more portions. Peripheral conductive housing structures 16 and/or the conductive rear wall of housing 12 may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide structures 16 from view of the user).

Display 14 may have an array of pixels that form an active area AA that displays images for a user of device 10. An inactive border region such as inactive area IA may run along one or more of the peripheral edges of active area AA.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a backplate) that spans the walls of housing 12 (i.e., a substantially rectangular sheet formed from one or more metal parts that is welded or otherwise connected between opposing sides of member 16). The backplate may form an exterior rear surface of device 10 or may be covered by layers such as thin cosmetic layers, protective coatings, and/or other coatings that may include dielectric materials such as glass, ceramic, plastic, or other structures that form the exterior surfaces of device 10 and/or serve to hide the backplate from view of the user. Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 16 and opposing conductive ground structures such as conductive portions of housing 12, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 20 and 22. If desired, the ground plane that is under active area AA of display 14 and/or other metal structures in device 10 may have portions that extend into parts of the ends of device 10 (e.g., the ground may extend towards the dielectric-filled openings in regions 20 and 22), thereby narrowing the slots in regions 20 and 22.

In general, device 10 may include any suitable number of antennas (e.g., one or more, two or more, three or more, four or more, etc.). The antennas in device 10 may be located at opposing first and second ends of an elongated device housing (e.g., at ends 20 and 22 of device 10 of FIG. 1), along one or more edges of a device housing, in the center of a device housing, in other suitable locations, or in one or more of these locations. The arrangement of FIG. 1 is merely illustrative.

Portions of peripheral housing structures 16 may be provided with peripheral gap structures. For example, peripheral conductive housing structures 16 may be provided with one or more peripheral gaps such as gaps 18, as shown in FIG. 1. The gaps in peripheral housing structures 16 may be filled with dielectric such as polymer, ceramic, glass, air, other dielectric materials, or combinations of these materials. Gaps 18 may divide peripheral housing structures 16 into one or more peripheral conductive segments. There may be, for example, two peripheral conductive segments in peripheral housing structures 16 (e.g., in an arrangement with two of gaps 18), three peripheral conductive segments (e.g., in an arrangement with three of gaps 18), four peripheral conductive segments (e.g., in an arrangement with four of gaps 18, etc.). The segments of peripheral conductive housing structures 16 that are formed in this way may form parts of antennas in device 10.

If desired, openings in housing 12 such as grooves that extend partway or completely through housing 12 may extend across the width of the rear wall of housing 12 and may penetrate through the rear wall of housing 12 to divide the rear wall into different portions. These grooves may also extend into peripheral housing structures 16 and may form antenna slots, gaps 18, and other structures in device 10. Polymer or other dielectric may fill these grooves and other housing openings. In some situations, housing openings that form antenna slots and other structure may be filled with a dielectric such as air.

In a typical scenario, device 10 may have one or more upper antennas and one or more lower antennas (as an example). An upper antenna may, for example, be formed at the upper end of device 10 in region 22. A lower antenna may, for example, be formed at the lower end of device 10 in region 20. The antennas may be used separately to cover identical communications bands, overlapping communications bands, or separate communications bands. The antennas may be used to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning system (GPS) communications or other satellite navigation system communications, Bluetooth® communications, etc.

Figure 2:
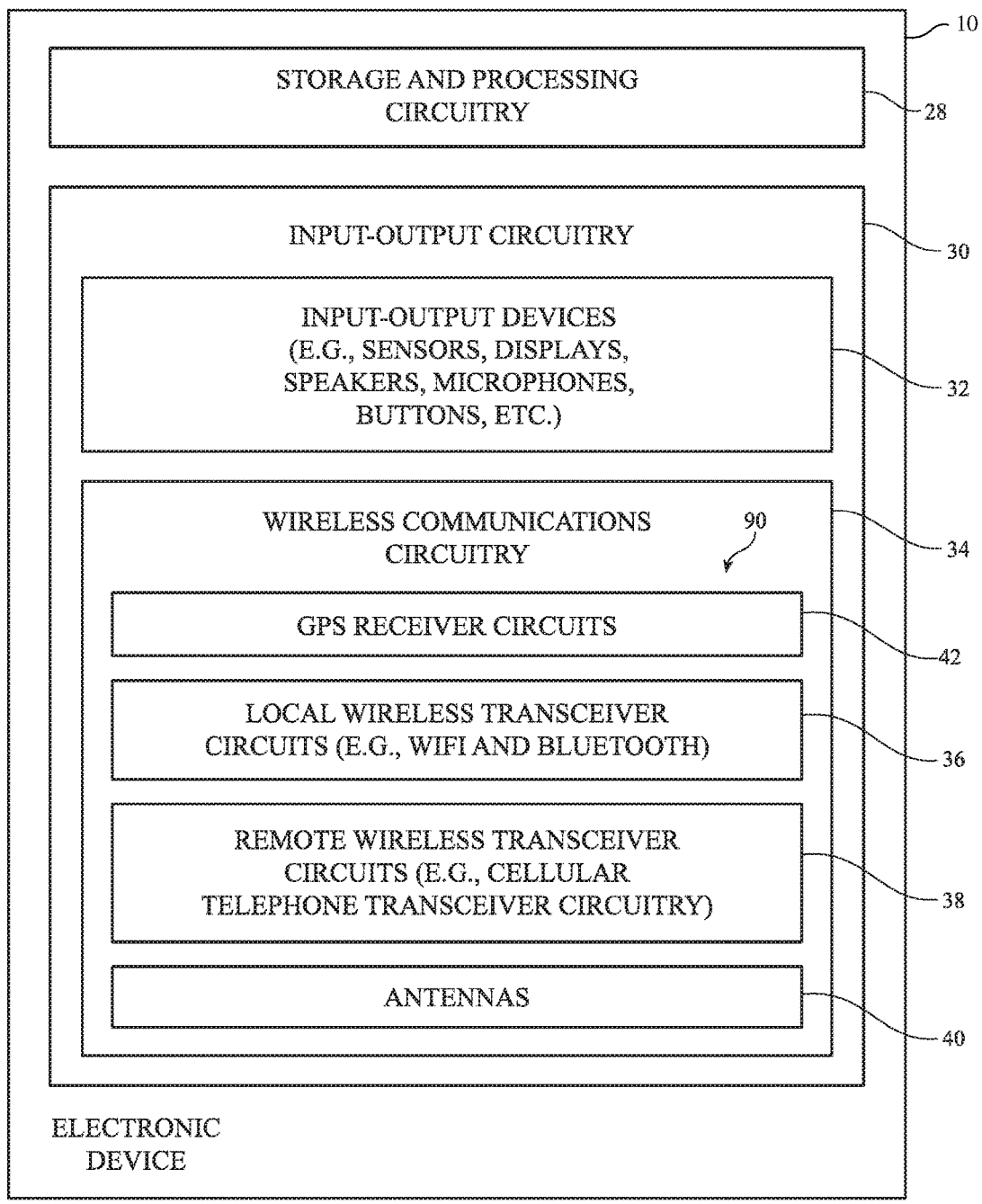
FIG. 2 is a schematic diagram of illustrative circuitry in an electronic device in accordance with an embodiment.

A schematic diagram showing illustrative components that may be used in device 10 of FIG. 1 is shown in FIG. 2. As shown in FIG. 2, device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, multiple-input and multiple-output (MIMO) protocols, antenna diversity protocols, etc.

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices 32 may include touch screens, displays without touch sensor capabilities, buttons, joysticks, scrolling wheels, touch pads, key pads, keyboards, microphones, cameras, buttons, speakers, status indicators, light sources, audio jacks and other audio port components, digital data port devices, light sensors, position and orientation sensors (e.g., sensors such as accelerometers, gyroscopes, and compasses), capacitance sensors, proximity sensors (e.g., capacitive proximity sensors, light-based proximity sensors, etc.), fingerprint sensors (e.g., a fingerprint sensor integrated with a button such as button 24 of FIG. 1 or a fingerprint sensor that takes the place of button 24), etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in frequency ranges such as a low communications band from 700 to 960 MHz, a low-midband from 960 to 1710 MHz, a midband from 1710 to 2170 MHz, a high band from 2300 to 2700 MHz, an ultra-high band from 3400 to 3700 MHz or other communications bands between 600 MHz and 4000 MHz or other suitable frequencies (as examples).

Circuitry 38 may handle voice data and non-voice data. Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc. Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, dipole antenna structures, monopole antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Figure 3:
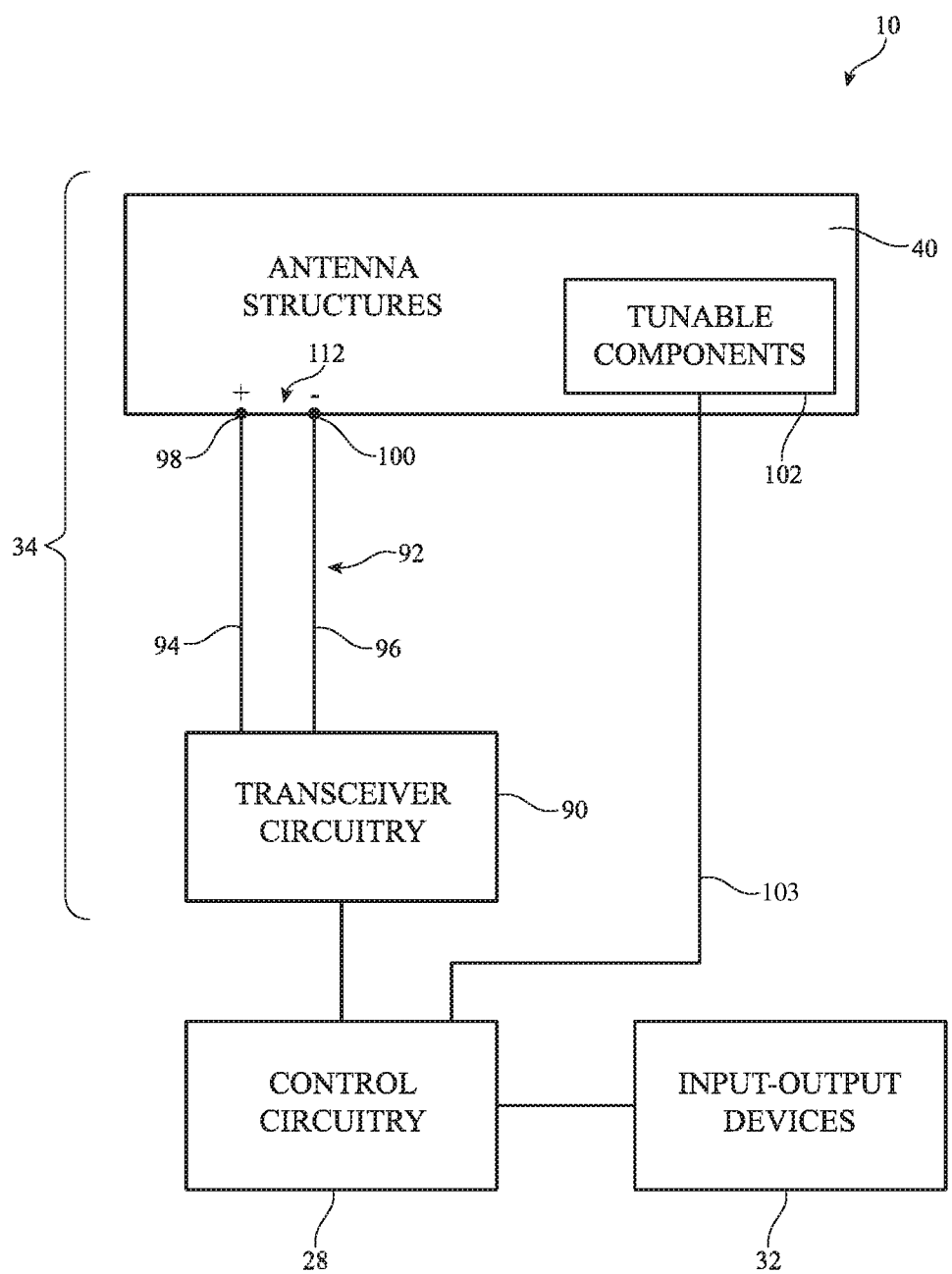
FIG. 3 is a schematic diagram of illustrative wireless communications circuitry in accordance with an embodiment.

As shown in FIG. 3, transceiver circuitry 90 in wireless circuitry 34 may be coupled to antenna structures 40 using paths such as path 92. Wireless circuitry 34 may be coupled to control circuitry 28. Control circuitry 28 may be coupled to input-output devices 32. Input-output devices 32 may supply output from device 10 and may receive input from sources that are external to device 10.

To provide antenna structures such as antenna(s) 40 with the ability to cover communications frequencies of interest, antenna(s) 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna(s) 40 may be provided with adjustable circuits such as tunable components 102 to tune antennas over communications bands of interest. Tunable components 102 may be part of a tunable filter or tunable impedance matching network, may be part of an antenna resonating element, may span a gap between an antenna resonating element and antenna ground, etc.

Tunable components 102 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures. During operation of device 10, control circuitry 28 may issue control signals on one or more paths such as path 103 that adjust inductance values, capacitance values, or other parameters associated with tunable components 102, thereby tuning antenna structures 40 to cover desired communications bands.

Path 92 may include one or more transmission lines. As an example, signal path 92 of FIG. 3 may be a transmission line having a positive signal conductor such as line 94 and a ground signal conductor such as line 96. Lines 94 and 96 may form parts of a coaxial cable, a stripline transmission line, or a microstrip transmission line (as examples). A matching network (e.g., an adjustable matching network formed using tunable components 102) may include components such as inductors, resistors, and capacitors used in matching the impedance of antenna(s) 40 to the impedance of transmission line 92. Matching network components may be provided as discrete components (e.g., surface mount technology components) or may be formed from housing structures, printed circuit board structures, traces on plastic supports, etc. Components such as these may also be used in forming filter circuitry in antenna(s) 40 and may be tunable and/or fixed components.

Transmission line 92 may be coupled to antenna feed structures associated with antenna structures 40. As an example, antenna structures 40 may form an inverted-F antenna, a slot antenna, a hybrid inverted-F slot antenna or other antenna having an antenna feed 112 with a positive antenna feed terminal such as terminal 98 and a ground antenna feed terminal such as ground antenna feed terminal 100. Positive transmission line conductor 94 may be coupled to positive antenna feed terminal 98 and ground transmission line conductor 96 may be coupled to ground antenna feed terminal 100. Other types of antenna feed arrangements may be used if desired. For example, antenna structures 40 may be fed using multiple feeds. The illustrative feeding configuration of FIG. 3 is merely illustrative.

Control circuitry 28 may use information from a proximity sensor (see, e.g., sensors 32 of FIG. 2), wireless performance metric data such as received signal strength information, device orientation information from an orientation sensor, device motion data from an accelerometer or other motion detecting sensor, information about a usage scenario of device 10, information about whether audio is being played through speaker 26, information from one or more antenna impedance sensors, and/or other information in determining when antenna(s) 40 is being affected by the presence of nearby external objects or is otherwise in need of tuning. In response, control circuitry 28 may adjust an adjustable inductor, adjustable capacitor, switch, or other tunable component 102 to ensure that antenna structures 40 operate as desired. Adjustments to component 102 may also be made to extend the coverage of antenna structures 40 (e.g., to cover desired communications bands that extend over a range of frequencies larger than antenna structures 40 would cover without tuning).

The presence or absence of external objects such as a user's hand may affect antenna loading and therefore antenna performance. Antenna loading may differ depending on the way in which device 10 is being held. For example, antenna loading and therefore antenna performance may be affected in one way when a user is holding device 10 in the user's right hand and may be affected in another way when a user is holding device 10 in the user's left hand. In addition, antenna loading and performance may be affected in one way when a user is holding device 10 to the user's head and in another way when the user is holding device 10 away from the user's head. To accommodate various loading scenarios, device 10 may use sensor data, antenna measurements, information about the usage scenario or operating state of device 10, and/or other data from input-output circuitry 32 to monitor for the presence of antenna loading (e.g., the presence of a user's hand, the user's head, or another external object). Device 10 (e.g., control circuitry 28) may then adjust adjustable components 102 in antenna 40 to compensate for the loading.

Antennas 40 may include slot antenna structures, inverted-F antenna structures (e.g., planar and non-planar inverted-F antenna structures), loop antenna structures, combinations of these, or other antenna structures.

Figure 4:
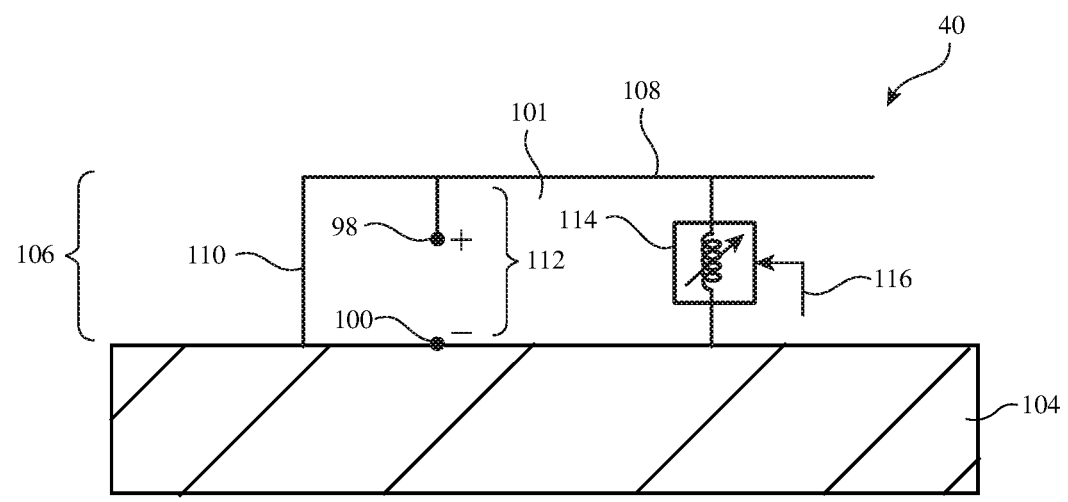
FIG. 4 is a schematic diagram of an illustrative inverted-F antenna in accordance with an embodiment.

An illustrative inverted-F antenna structure is shown in FIG. 4. As shown in FIG. 4, inverted-F antenna structure 40 (sometimes referred to herein as antenna 40 or inverted-F antenna 40) may include an inverted-F antenna resonating element such as antenna resonating element 106 and an antenna ground (ground plane) such as antenna ground 104. Antenna resonating element 106 may have a main resonating element arm such as arm 108. The length of arm 108 may be selected so that antenna structure 40 resonates at desired operating frequencies. For example, the length of arm 108 (or a branch of arm 108) may be a quarter of a wavelength at a desired operating frequency for antenna 40. Antenna structure 40 may also exhibit resonances at harmonic frequencies. If desired, slot antenna structures or other antenna structures may be incorporated into an inverted-F antenna such as antenna 40 of FIG. 4 (e.g., to enhance antenna response in one or more communications bands). As an example, a slot antenna structure may be formed between arm 108 or other portions of resonating element 106 and ground 104. In these scenarios, antenna 40 may include both slot antenna and inverted-F antenna structures and may sometimes be referred to as a hybrid inverted-F and slot antenna.

Arm 108 may be separated from ground 104 by a dielectric-filled opening such as dielectric gap 101. Antenna ground 104 may be formed from housing structures such as a conductive support plate, printed circuit traces, metal portions of electronic components, or other conductive ground structures. Gap 101 may be formed by air, plastic, and/or other dielectric materials.

Main resonating element arm 108 may be coupled to ground 104 by return path 110. Antenna feed 112 may include positive antenna feed terminal 98 and ground antenna feed terminal 100 and may run parallel to return path 110 between arm 108 and ground 104. If desired, inverted-F antenna structures such as illustrative antenna structure 40 of FIG. 4 may have more than one resonating arm branch (e.g., to create multiple frequency resonances to support operations in multiple communications bands) or may have other antenna structures (e.g., parasitic antenna resonating elements, tunable components to support antenna tuning, etc.). Arm 108 may have other shapes and may follow any desired path if desired (e.g., paths having curved and/or straight segments).

If desired, antenna 40 may include one or more adjustable circuits (e.g., tunable components 102 of FIG. 3) that are coupled to antenna resonating element structures 106 such as arm 108. As shown in FIG. 4, for example, tunable components 102 such as adjustable inductor 114 may be coupled between antenna resonating element arm structures in antenna 40 such as arm 108 and antenna ground 104 (i.e., adjustable inductor 114 may bridge gap 101). Adjustable inductor 114 may exhibit an inductance value that is adjusted in response to control signals 116 provided to adjustable inductor 114 from control circuitry 28.

Figure 5:
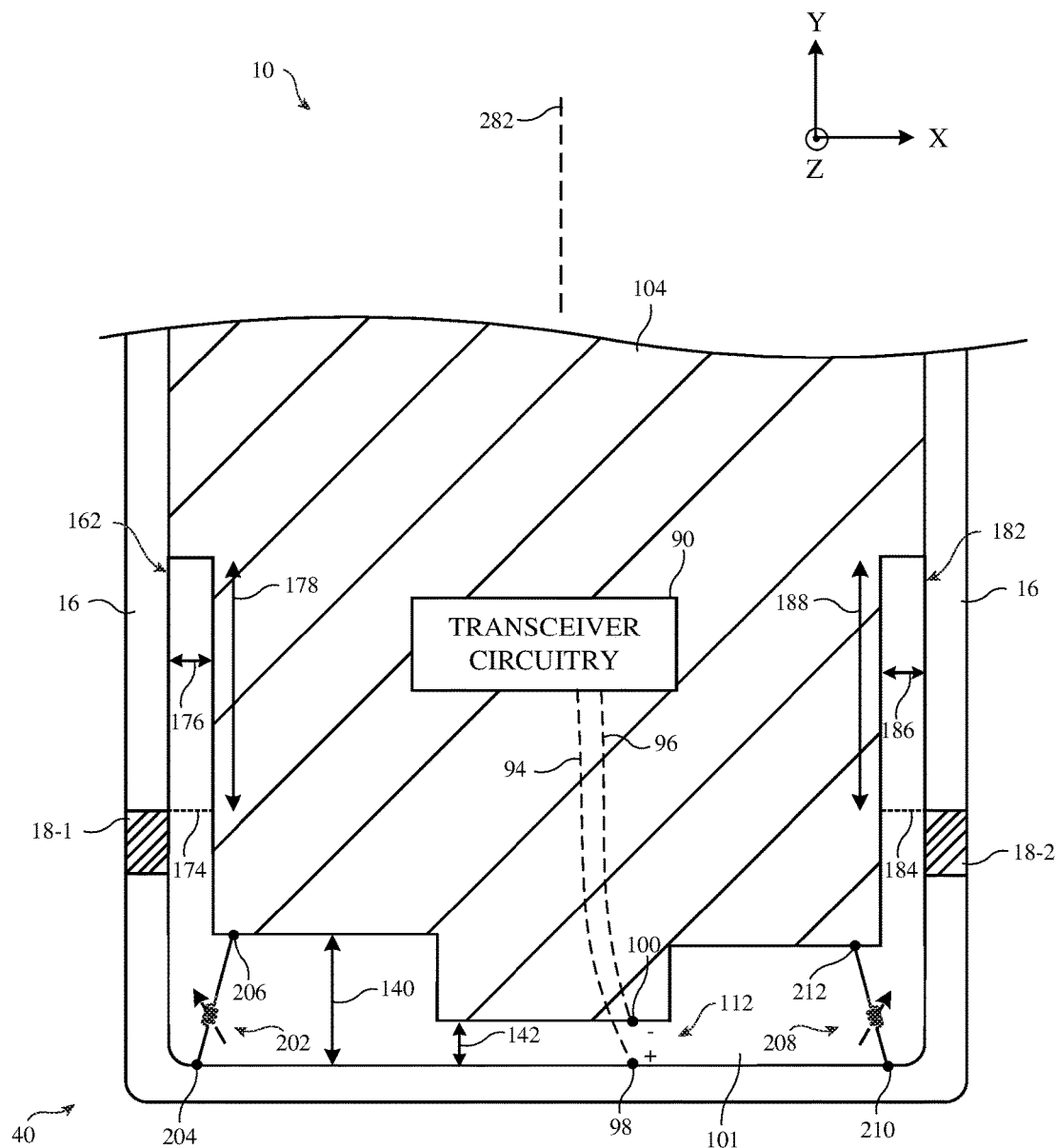
FIG. 5 is a top view of illustrative antenna structures that are adjustable between multiple operating modes in an electronic device in accordance with an embodiment.

A top interior view of an illustrative portion of device 10 that contains antennas is shown in FIG. 5. As shown in FIG. 5, device 10 may have peripheral conductive housing structures such as peripheral conductive housing structures 16. Peripheral conductive housing structures 16 may be divided by dielectric-filled peripheral gaps (e.g., plastic gaps) 18 such as a first gaps 18-1 and a second gap 18-2. The resonating element for antenna 40 may include an inverted-F antenna resonating element arm such as arm 108 that is formed from a segment of peripheral conductive housing structures 16 extending between gaps 18-1 and 18-2. Air and/or other dielectric may fill slot 101 between arm 108 and ground structures 104. If desired, opening 101 may be configured to form a slot antenna resonating element structure that contributes to the overall performance of the antenna. Antenna ground 104 may be formed from conductive housing structures, from electrical device components in device 10, from printed circuit board traces, from strips of conductor such as strips of wire and metal foil, or other conductive structures. In one suitable arrangement ground 104 is formed from conductive portions of housing 12 (e.g., portions of a rear wall of housing 12 and portions of peripheral conductive housing structures 16 that are separated from arm 108 by peripheral gaps 18) and conductive portions of display 14 (e.g., conductive portions of a display panel, a conductive plate for supporting the display panel, and/or a conductive frame for supporting the conductive plate and/or the display panel).

As shown in FIG. 5, ground 104 may have portions that are separated from the segment of peripheral conductive housing structures 16 between gaps 18-2 and 18-1 by a distance 140. Slot 101 may have a width 140 in these regions. Other portions of ground plane 104 may be separated from peripheral conductive housing structures 16 by a shorter distance 142. Slot 101 may have a width 142 in these regions.

Positive transmission line conductor 94 and ground transmission line conductor 96 of transmission line 92 may be coupled between transceiver circuitry 90 and antenna feed 112. Positive antenna feed terminal 98 of feed 112 may be coupled to arm 108. Ground antenna feed terminal 100 of feed 112 may be coupled to ground 104. Antenna feed 112 may be coupled across slot 101 at a location along ground plane 104 that is separated from peripheral conductive structures 16 by distance 142. Distance 142 may, for example, be selected so that a desired distributed capacitance is formed between ground 104 and peripheral conductive housing structures 16. The distributed capacitance may be selected to ensure that antenna 40 is impedance matched to transmission line 92, for example. The portion of ground plane 104 that is separated from peripheral conductive housing structures 16 by distance 142 may be interposed between two regions where ground plane 104 is separated from peripheral conductive housing structures 16 by distance 140, if desired. Transceiver circuitry 90 (e.g., remote wireless transceiver circuitry 38, local wireless transceiver circuitry 36, and/or GPS receiver circuitry 42 in FIG. 2) may convey radio-frequency signals in frequency ranges such as a low communications band from 700 to 960 MHz, a low-midband from 960 to 1710 MHz, a midband from 1710 to 2170 MHz, a high band from 2300 to 2700 MHz, an ultra-high band from 3400 to 3700 MHz, 2.4 GHz and 5 GHz bands for WiFi® (IEEE 802.11) communications, and/or a 1575 MHz GPS band using antenna 40 and feed 112.

Ground plane 104 may have any desired shape within device 10. For example, the lower edge of ground plane 104 may be aligned with gap 18-1 in peripheral conductive hosing structures 16 (e.g., the upper or lower edge of gap 18-1 may be aligned with the edge of ground plane 104 defining slot 101 adjacent to gap 18-1). This example is merely illustrative. If desired, as shown in FIG. 5, ground 104 may include a vertical slot such as slot 162 adjacent to gap 18-1 that extends above the edges of gap 18-1 (e.g., along the Y-axis of FIG. 5). Similarly, the lower edge of ground plane 104 may be aligned with the gap 18-2 (e.g., the upper or lower edge of gap 18-2 may be aligned with the edge of ground plane 104 defining slot 101 adjacent to gap 18-2) or may extend above the edges of gap 18-2.

As shown in FIG. 5, vertical slot 162 adjacent to gap 18-1 may extend beyond the upper edge (e.g., upper edge 174) of gap 18-1 (e.g., in the direction of the Y-axis of FIG. 5). Slot 162 may, for example, have two edges that are defined by ground 104 and one edge that is defined by peripheral conductive structures 16. Slot 162 may have an open end defined by an open end of slot 101 at gap 18-1. Slot 162 may have a width 176 that separates ground 104 from the portion of peripheral conductive structures 16 above gap 18-1 (e.g., in the direction of the X-axis of FIG. 5). Because the portion of peripheral conductive structures 16 above gap 18-1 is shorted to ground 104 (and thus forms part of the antenna ground for antenna structures 40), slot 162 may effectively form an open slot having three sides defined by the antenna ground for antenna structures 40. Slot 162 may have any desired width (e.g., about 2 mm, less than 4 mm, less than 3 mm, less than 2 mm, less than 1 mm, more than 0.5 mm, more than 1.5 mm, more than 2.5 mm, 1-3 mm, etc.). Slot 162 may have an elongated length 178 (e.g., perpendicular to width 176). Slot 162 may have any desired length (e.g., 10-15 mm, more than 5 mm, more than 10 mm, more than 15 mm, more than 30 mm, less than 30 mm, less than 20 mm, less than 15 mm, less than 10 mm, between 5 and 20 mm, etc.).

Electronic device 10 may be characterized by longitudinal axis 282. Length 178 may extend parallel to longitudinal axis 282 (e.g., the Y-axis of FIG. 5). Portions of slot 162 may contribute slot antenna resonances to antenna 40 in one or more frequency bands if desired. For example, the length and width of slot 162 (e.g., the perimeter of slot 162) may be selected so that antenna 40 resonates at desired operating frequencies. If desired, the overall length of slots 101 and 162 may be selected so that antenna 40 resonates at desired operating frequencies.

If desired, ground plane 104 may include an additional vertical slot 182 adjacent to gap 18-2 that extends beyond the upper edge (e.g., upper edge 184) of gap 18-2 (e.g., in the direction of the Y-axis of FIG. 5). Slot 182 may, for example, have two edges that are defined by ground 104 and one edge that is defined by peripheral conductive structures 16. Slot 182 may have an open end defined by an open end of slot 101 at gap 18-2. Slot 182 may have a width 186 that separates ground 104 from the portion of peripheral conductive structures 16 above gap 18-1 (e.g., in the direction of the X-axis of FIG. 5). Because the portion of peripheral conductive structures 16 above gap 18-2 is shorted to ground 104 (and thus forms part of the antenna ground for antenna structures 40), slot 182 may effectively form an open slot having three sides defined by the antenna ground for antenna structures 40. Slot 182 may have any desired width (e.g., about 2 mm, less than 4 mm, less than 3 mm, less than 2 mm, less than 1 mm, more than 0.5 mm, more than 1.5 mm, more than 2.5 mm, 1-3 mm, etc.). Slot 182 may have an elongated length 188 (e.g., perpendicular to width 186). Slot 182 may have any desired length (e.g., 10-15 mm, more than 5 mm, more than 10 mm, more than 15 mm, more than 30 mm, less than 30 mm, less than 20 mm, less than 15 mm, less than 10 mm, between 5 and 20 mm, etc.).

Length 188 may extend parallel to longitudinal axis 282 (e.g., the Y-axis of FIG. 5). Portions of slot 182 may contribute slot antenna resonances to antenna 40 in one or more frequency bands if desired. For example, the length and width of slot 182 may be selected so that antenna 40 resonates at desired operating frequencies. If desired, the overall length of slots 101 and 182 may be selected so that antenna 40 resonates at desired operating frequencies. If desired, the overall length of slots 101, 162, and 182 may be selected so that antenna 40 resonates at desired operating frequencies.

A return path such as path 110 of FIG. 4 may be formed by a fixed conductive path bridging slot 101 and/or one or more adjustable components such as adjustable components 202 and/or 208 as shown in FIG. 5 (e.g., adjustable components such as tuning components 102 of FIG. 3). Adjustable components 202 and 208 may sometimes be referred to herein as tuning components, tunable components, tuning circuits, tunable circuits, adjustable components, or adjustable tuning components.

Adjustable component 202 may bridge slot 101 at a first location along slot 101 (e.g., component 202 may be coupled between terminal 206 on ground plane 104 and terminal 204 on peripheral conductive structures 16). Adjustable component 208 may bridge slot 101 at a second location along slot 101 (e.g., component 208 may be coupled between terminal 212 on ground plane 104 and terminal 210 on peripheral conductive structures 16). Ground antenna feed terminal 100 may be interposed between terminal 206 and terminal 212 on ground plane 104. Positive antenna feed terminal 98 may be interposed between terminal 204 and terminal 210 on peripheral conductive structures 16. Terminal 212 may be closer to ground antenna feed terminal 100 than terminal 206. Terminal 210 may be closer to positive antenna feed terminal 98 than terminal 204. Terminals 206 and 212 may be formed on portions of ground plane 104 that are separated from peripheral conductive housing structures 16 by distance 140.

Components 202 and 208 may include switches coupled to fixed components such as inductors for providing adjustable amounts of inductance or an open circuit between ground 104 and peripheral conductive structures 16. Components 202 and 208 may also include fixed components that are not coupled to switches or a combination of components that are coupled to switches and components that are not coupled to switches. These examples are merely illustrative and, in general, components 202 and 208 may include other components such as adjustable return path switches, switches coupled to capacitors, or any other desired components.

Components 202 and 208 may be adjusted based on the operating environment of the electronic device. For example, electronic device 10 may have at least three modes of operation that correspond to different tuning settings of components 202 and 208. A desired mode of operation may be selected for use based on the presence or absence of external objects such as a user's hand or other body part in the vicinity of antenna 40 and/or based on the frequency bands to be used for communications. Components 202 and 208 may provide antenna 40 with flexibility to accommodate different loading conditions (e.g., different loading conditions that may arise due to the presence of a user's hand or other external object on various different portions of device 10 adjacent to various different corresponding portions of antenna 40).

Components 202 and 208 may be formed between peripheral conductive housing structures 16 and ground plane 104 using any desired structures. For example, components 202 and 208 may be formed on a printed circuit such as a flexible printed circuit board that is coupled between peripheral conductive housing structures 16 and ground plane 104. Antenna ground 104 may include a conductive layer of housing 12 (e.g., a conductive backplate for device 10). If desired, additional conductive layers may be used to form portions of antenna ground 104. For example, ground plane 104 may include conductive portions of display 14 of FIG. 1 (e.g., conductive portions of a display panel, a conductive plate for supporting the display panel, and/or a conductive frame for supporting the conductive plate and/or the display panel). Ground terminals 206, 100, and 212 may be coupled to the conductive layer of housing 12, the conductive portion of display 14, or other conductive structures that form antenna ground 104. If desired, conductive structures such as vertical conductive interconnect structures (e.g., a bracket, clip, spring, pin, screw, solder, weld, conductive adhesive, wire, metal strip, etc.) may be used to short the conductive layer of housing 12 to the conductive portion of display 14 that forms a part of antenna ground 104 (e.g., at locations 206, 100, and/or 212). Electrically connecting different components of the device ground (e.g., ground 104 in FIG. 5) with vertical conductive interconnect structures may ensure that the conductive structures that are located the closest to resonating element arm 108 are held at a ground potential and form a part of antenna ground 104. This may serve to optimize the antenna efficiency of antenna 40, for example.

Control circuitry such as storage and processing circuitry 28 of FIG. 2 may control tuning components 202 and 208 and/or transceiver to place device 10 in one of at least first, second, and third modes of operation. In the first mode of operation, antenna 40 may be placed in a first tuning mode or state in which tuning components 202 and 208 are controlled using a first configuration or setting. In the second mode of operation, antenna 40 may be placed in a second tuning mode or state in which tuning components 202 and 208 are controlled using a second configuration or setting. In the third mode of operation, antenna 40 may be placed in a third tuning mode or state in which tuning components 202 and 208 are controlled using a third configuration or setting.

Antenna 40 may be configured to handle different frequency bands in each tuning mode. For example, in the first tuning mode, antenna 40 may be configured to perform communications in a low band, midband, and high band. In the second tuning mode of antenna 40 may also be configured to perform communications in the low band, midband, and high band. However, the first and second tuning modes may compensate for antenna loading by an external device such as a user's hand in different ways. For example, in the first tuning mode, antenna 40 may be configured to operate with a relatively high antenna efficiency if device 10 is being held by a user's right hand and a relatively low antenna efficiency if device 10 is being held by a user's left hand, whereas in the second tuning mode antenna 40 may be configured to operate with a relatively high antenna efficiency if device 10 is being held by a user's left hand and a relatively low antenna efficiency if device 10 is being held by a user's right hand. In other words, in the first and second tuning modes, antenna 40 may perform wireless communications in the low band, midband, and high band, but may be sensitive to certain operating conditions such as which hand a user is using to hold device 10.

In general, antenna 40 may be more susceptible to changing loading conditions and detuning when operating in the low band than when operating in the midband or high band. In the third tuning mode, antenna 40 may be configured to operate with a relatively high efficiency regardless of which hand a user is using to hold device 10 (e.g., antenna 40 may be resilient or reversible to the handedness of the user). However, when placed in the third tuning mode, antenna 40 may only cover a subset of the frequency bands that antenna 40 is capable of covering in the first and second tuning modes. For example, in the third tuning mode antenna 40 may cover the midband and high band without covering the low band.

Figure 6:
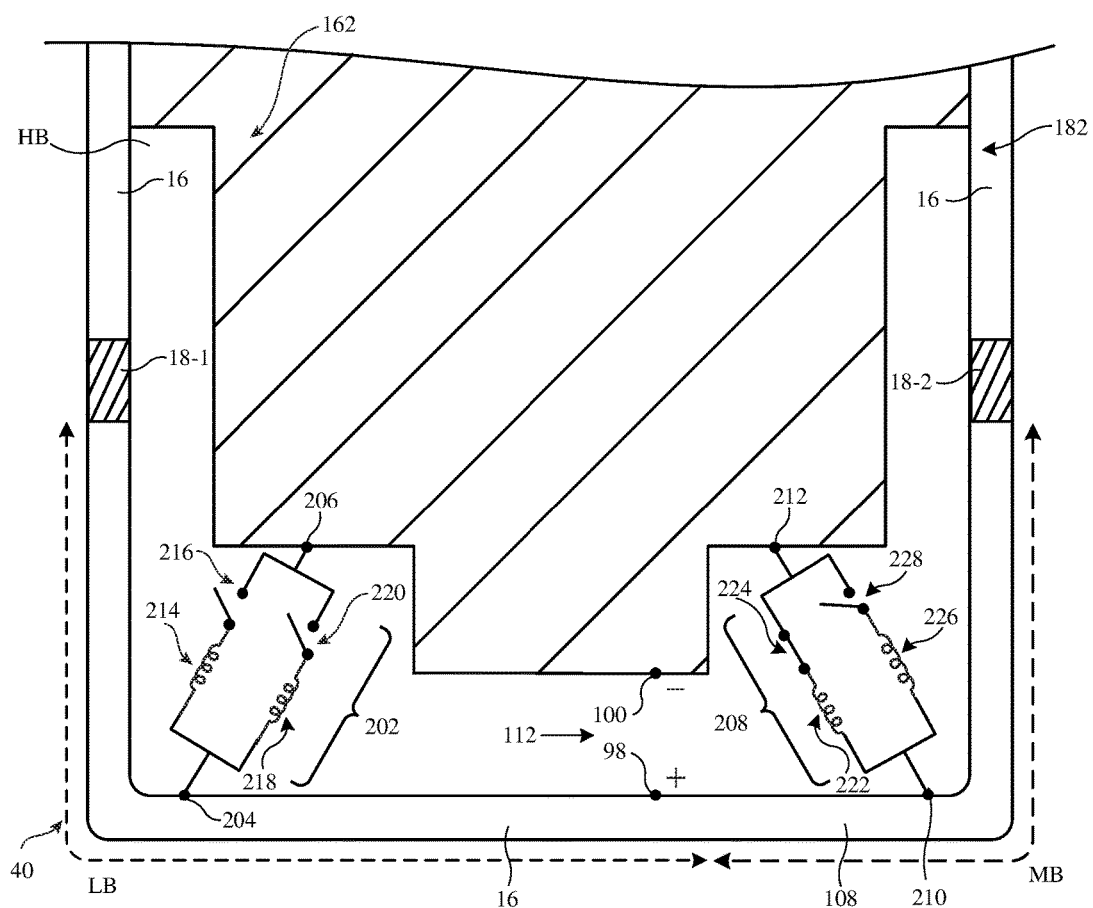
FIG. 6 is a top view of the illustrative antenna structures of FIG. 5 while placed in a first operating mode in accordance with an embodiment.
Figure 7:
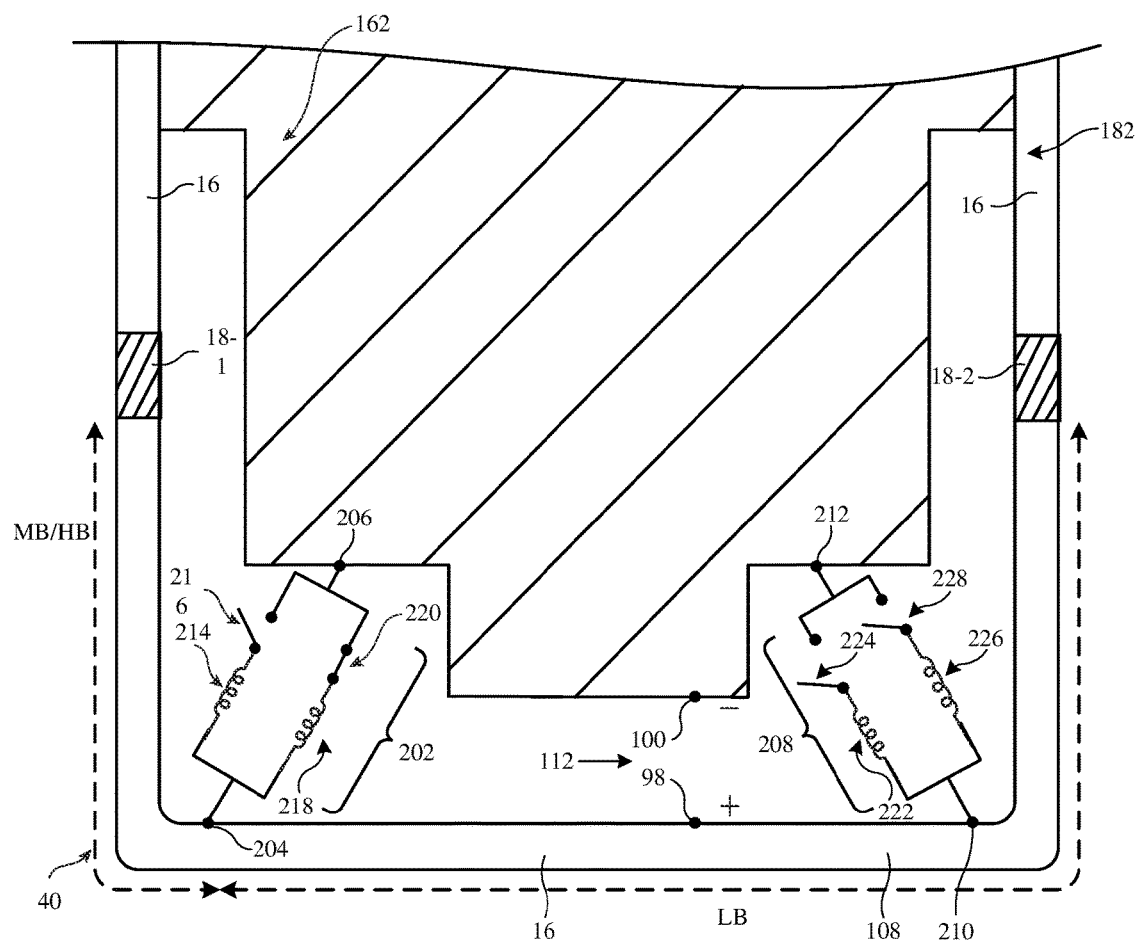
FIG. 7 is a top view of the illustrative antenna structures of FIG. 5 while placed in a second operating mode in accordance with an embodiment.
Figure 8:
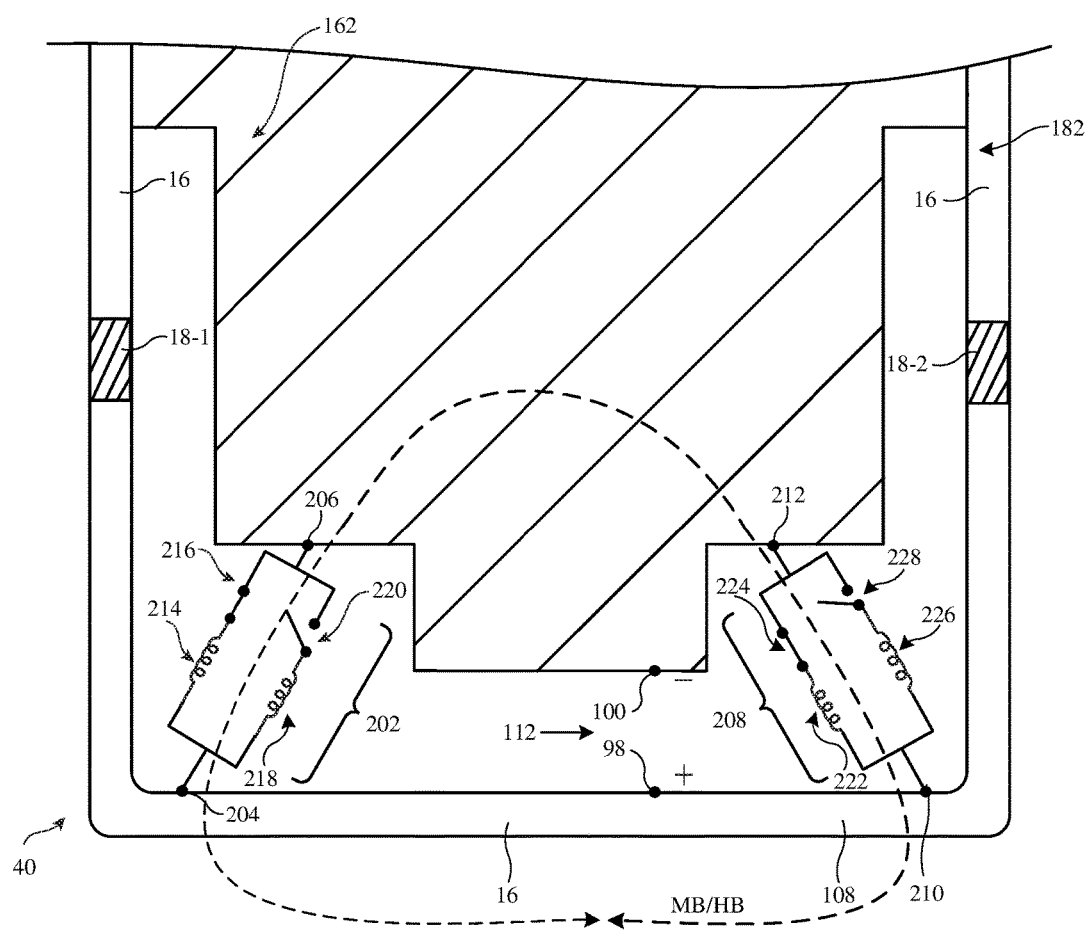
FIG. 8 is a top view of the illustrative antenna structures of FIG. 5 while placed in a third operating mode in accordance with an embodiment.

FIGS. 6-8 are top views of electronic device 10 showing how antenna 40 may be tuned in each of the first, second, and third operating modes. In particular, FIG. 6 is a diagram showing how antenna 40 may be controlled when placed in the first tuning mode, FIG. 7 is a diagram showing how antenna 40 may be controlled when placed in the second tuning mode, and FIG. 8 is a diagram showing how antenna 40 may be controlled when placed in the third tuning mode.

As shown in FIG. 6, component 202 may include inductor circuitry such as a first inductor 214 coupled in parallel with a second inductor 218 between terminals 204 and 206. Inductor 214 may be coupled in series with switch 216 between terminals 204 and 206, whereas inductor 218 may be coupled in series with switch 220 between terminals 204 and 206. Switches 216 and 220 may selectively connect or disconnect the respective inductor across slot 101. For example, switch 216 may have a first state in which switch 216 is closed and inductor 214 is connected between terminal 204 and terminal 206. Switch 216 may have a second state in which switch 216 is open and inductor 214 is not connected between terminal 204 and terminal 206. Similarly, switch 220 may have a first state in which switch 220 is closed and inductor 218 is connected between terminal 204 and terminal 206. Switch 220 may have a second state in which switch 220 is open and inductor 218 is not connected between terminal 204 and terminal 206. Inductors 214 and 218 may each exhibit any desired inductance values (e.g., 1-4 nH, 1-10 nH, greater than 1 nH, greater than 2 nH, less than 10 nH, less than 6 nH, less than 4 nH, etc.).

Component 208 may include two inductors such as a first inductor 222 coupled in parallel with a second inductor 226 between terminals 210 and 212. Inductor 222 may be coupled in series with switch 224 between terminals 210 and 212, whereas inductor 226 may be coupled in series with switch 228 between terminals 210 and 212. Switches 224 and 228 may selectively connect or disconnect the respective inductor across slot 101. For example, switch 224 may have a first state in which switch 224 is closed and inductor 222 is connected between terminal 210 and terminal 212. Switch 224 may have a second state in which switch 224 is open and inductor 222 is not connected between terminal 210 and terminal 212. Similarly, switch 228 may have a first state in which switch 228 is closed and inductor 226 is connected between terminal 210 and terminal 212. Switch 228 may have a second state in which switch 228 is open and inductor 226 is not connected between terminal 210 and terminal 212. Inductors 222 and 226 may each exhibit any desired inductance values (e.g., 1-4 nH, 1-10 nH, greater than 1 nH, greater than 2 nH, less than 10 nH, less than 6 nH, less than 4 nH, etc.).

When antenna structures 40 are operated in the first tuning mode (as shown in FIG. 6), component 202 may form an open circuit between terminal 204 on peripheral conductive housing structure 16 and terminal 206 on ground plane 104 (e.g., switches 216 and 220 may both be turned off or open). Switch 224 of component 208 may be closed to connect inductor 222 between terminals 210 and 212 whereas switch 228 is open (disconnecting inductor 226 between terminals 210 and 212). This example is merely illustrative and, if desired, switch 228 may be closed and switch 224 may be open or both switches 224 and 228 may be closed in the first tuning mode. If desired, switches 224 and/or 228 may be toggled to tune antenna 40 while antenna 40 is placed in the first tuning mode. In other words, in the first tuning mode, all of the adjustable inductors of component 202 may be disconnected across slot 101 while component 208 performs antenna tuning by coupling one or both of inductors 222 and 226 across slot 101.

The example of FIG. 6 in which two inductors are included in component 202 and component 208 is merely illustrative. If desired, components 202 and 208 may include one, two, three, four, or more than four inductors. Components 202 and 208 may have the same number of inductors or a different number of inductors. Components 202 and/or 208 may include capacitive components in addition to or instead of inductors if desired. The example of FIG. 6 in which the switching circuitry in components 202 and 208 are single-pole single-throw (SPST) switches is merely illustrative. In general, components 202 and 208 may include any desired switching circuitry (e.g., single-pole double throw (SP2T) switches, etc.).

In the first tuning mode, the resonance of antenna 40 in low band LB (e.g., from 700 MHz to 960 MHz or another suitable frequency range) may be associated with the distance along peripheral conductive structures 16 between feed 112 and gap 18-1, for example. FIG. 6 is a view from the front of device 10, so gap 18-1 of FIG. 6 lies on the left edge of device 10 when device 10 is viewed from the front (e.g., the side of device 10 on which display 14 is formed) and lies on the right edge of device 10 when device 10 is viewed from behind.

Tunable components such as component 208 or other tunable components (not shown) may be used to tune the response of antenna 40 in low band LB in the first tuning mode, if desired. The resonance of antenna 40 in midband MB (e.g., from approximately 1710 MHz to 2170 MHz) may be associated with the distance along peripheral conductive structures 16 between feed 112 and gap 18-2, for example. Antenna performance in midband MB may also be supported by slot 182 in ground plane 104. Tunable components such as component 208 may be used to tune the response of antenna 40 in midband MB in the first tuning mode. Antenna performance in high band HB (e.g., 2300 MHz to 2700 MHz) may be supported by slot 162 in ground plane 104 and/or by a harmonic mode of a resonance supported by antenna resonating element arm 108. Tunable components such as component 208 may be used to tune the response of antenna 40 in high band HB in the first tuning mode if desired.

When operated in the first tuning mode, antenna 40 may be particularly susceptible to loading and detuning in low band LB when device 10 is being held by a user's left hand (e.g., because the user's left palm, which typically loads antenna 40 more than the user's fingers, may be in close proximity with the low band portion of resonating element 108 adjacent to gap 18-1 when held in the user's left hand). However, antenna 40 may be relatively immune to loading and detuning in low band LB when device 10 is being held by a user's right hand in the first tuning mode (e.g., because the user's right palm is located adjacent to gap 18-2 and relatively far from the low band portion of resonating element 108). The first tuning mode may therefore sometimes be referred to herein as the right hand tuning mode of antenna 40 (e.g., device 10 may be placed in a so-called right hand operating mode or state when antenna 40 is placed in the right hand tuning mode). The loading of antenna 40 in low band LB by the user's left hand may therefore cause antenna 40 to exhibit deteriorated antenna efficiency in low band LB when antenna 40 is placed in the first tuning mode. In order to mitigate such antenna loading by the user's left hand, antenna 40 may be placed in the second or third tuning modes.

As shown in FIG. 7, when antenna structures 40 are operated in the second tuning mode, component 208 may form an open circuit between terminal 210 on peripheral conductive housing structure 16 and terminal 212 on ground 104 (e.g., switches 224 and 228 may both be open or turned off). Switch 220 of component 202 may be closed to connect inductor 218 between terminals 204 and 206 whereas switch 216 may be open (disconnecting inductor 214 between terminals 204 and 206). This example is merely illustrative, and, if desired, switch 216 may be closed and switch 220 may be open or both switches 216 and 220 may be closed in the second tuning mode. If desired, switches 216 and/or 220 may be toggled to tune antenna 40 while antenna 40 is placed within the second tuning mode. In other words, in the second tuning mode, all of the adjustable inductors of component 208 may be disconnected across slot 101 while component 202 performs antenna tuning by coupling one or both of inductors 214 and 218 across slot 101.

In the second tuning mode, the resonance of antenna 40 in low band LB (e.g., from 700 MHz to 960 MHz or another suitable frequency range) may be associated with the distance along peripheral conductive structures 16 between the position of component 202 (i.e., terminal 204) of FIG. 7 and gap 18-2, for example. FIG. 7 is a view from the front of device 10, so gap 18-2 of FIG. 7 lies on the right edge of device 10 when device 10 is viewed from the front (e.g., the side of device 10 on which display 14 is formed) and lies on the left edge of device 10 when device 10 is viewed from behind.

Tunable components such as component 202 or other tunable components (not shown) may be used to tune the response of antenna 40 in low band LB in the second tuning mode, if desired. The resonance of antenna 40 in midband MB (e.g., from approximately 1710 MHz to 2170 MHz) may be associated with the distance along peripheral conductive structures 16 between the position of component 202 (i.e., terminal 204) and gap 18-1, for example. Antenna performance in midband MB may also be supported by slot 182 in ground plane 104. Tunable components such as component 202 may be used to tune the response of antenna 40 in midband MB in the second tuning mode. The resonance of antenna 40 at high band HB (e.g., 2300 MHz to 2700 MHz) may be associated with the distance along peripheral conductive structures 16 between the position of component 202 (i.e., terminal 204) and gap 18-1, for example. Antenna performance in high band HB may also be supported by slot 162 in ground plane 104 and/or by a harmonic mode of a resonance supported by antenna resonating element arm 108. Tunable components such as component 202 may be used to tune the response of antenna 40 in high band HB in the second tuning mode if desired.

When operated in the second tuning mode, antenna 40 may be particularly susceptible to loading and detuning in low band LB when device 10 is being held by a user's right hand (e.g., because the user's right palm, which typically loads antenna 40 more than the user's fingers, may be in close proximity with the low band portion of resonating element 108 adjacent to gap 18-2 when held in the user's right hand). However, antenna 40 may be relatively immune to loading and detuning in low band LB when device 10 is being held by a user's left hand in the second tuning mode (e.g., because the user's left palm is located adjacent to gap 18-1 and relatively far from the low band portion of resonating element 108). The second tuning mode may therefore sometimes be referred to herein as the left hand tuning mode of antenna 40 (e.g., device 10 may be placed in a so-called left hand operating mode or state when antenna 40 is placed in the left hand tuning mode). The loading of antenna 40 in low band LB by the user's right hand may therefore cause antenna 40 to exhibit deteriorated antenna efficiency in low band LB when antenna 40 is placed in the second tuning mode. In order to mitigate such antenna loading by the user's right hand, antenna 40 may be placed in the first or third tuning modes.

As shown in FIG. 8, when antenna 40 is in the third tuning mode, at least one switch in both component 202 and component 208 is closed. For example, switch 224 may be closed to connect inductor 222 between terminals 210 and 212 and switch 228 may be open to disconnect inductor 226 between terminals 210 and 212. In other suitable arrangements, however, switch 228 may be closed and switch 224 may be open or both switches 224 and 228 may be closed. Similarly, switch 220 may be open to disconnect inductor 218 between terminals 204 and 206 and switch 216 may be closed to connect inductor 214 between terminals 204 and 206. In other suitable arrangements, however, switch 220 may be closed and switch 216 may be open or both switches 216 and 220 may be closed. If desired, switches 216, 220, 224 and 228 may be toggled to tune antenna 40 while antenna 40 is placed in the third tuning mode. In other words, in the third tuning mode, components 202 and 208 perform antenna tuning by coupling one or both of inductors 214 and 218 and one or both of inductors 222 and 226 across slot 101.

In the third tuning mode, the resonance of antenna 40 in midband MB and high band HB may be associated with a conductive loop path that includes portions of peripheral conductive structures 16 (e.g., the portion of peripheral conductive structures 16 extending between terminal 204 of component 202 and terminal 210 of component 208), component 202, ground plane 104, and component 208.

When operated in the third tuning mode, antenna 40 may be substantially immune to changes in loading dependent on how the user is holding device 10 (e.g., antenna 40 may exhibit satisfactory antenna efficiency regardless of whether the user is holding device 10 with their left or right hand). However, at the same time, antenna 40 may not be able to support a resonance at relatively low frequencies such as frequencies in low band LB when placed in the third tuning mode. In addition, antenna 40 may exhibit improved midband and/or high band efficiency relative to the first and second tuning modes. However, if it is desired to communicate in low band LB (e.g., based on an assignment to device 10 by external communications equipment such as a wireless base station or access point, based on a control algorithm performed by storage and processing circuitry 28, etc.), antenna 40 may be placed in the first or second tuning modes. Storage and processing circuitry 28 may adjust antenna 40 between the first, second and third tuning modes to ensure satisfactory performance in any desired bands over time regardless of environmental conditions.

Figure 9:
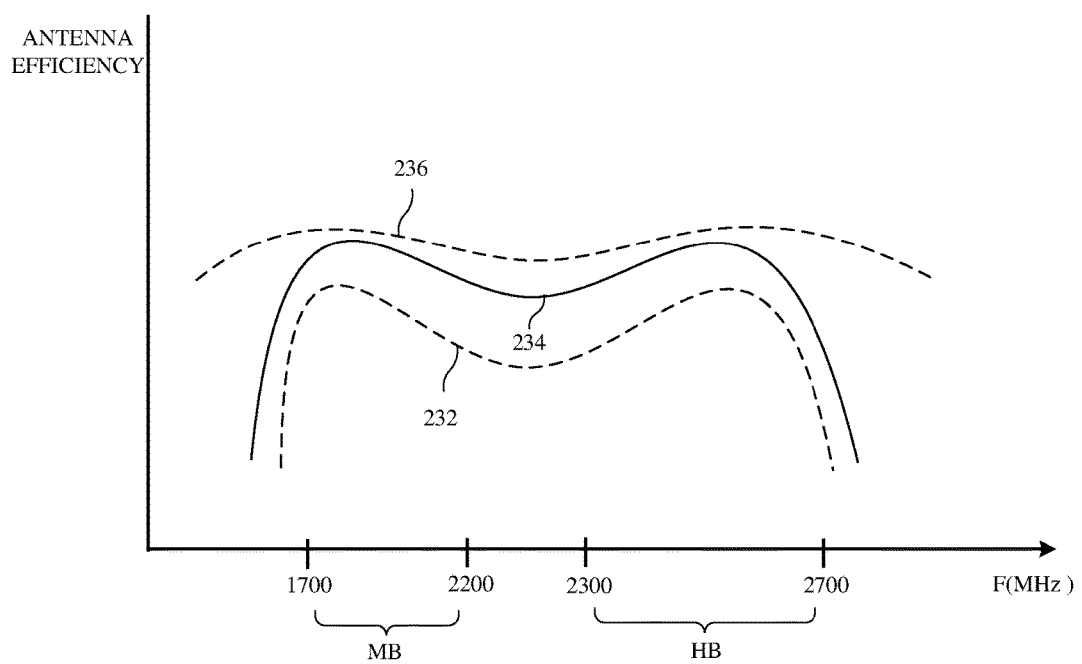
FIG. 9 is a graph of antenna efficiency as a function of frequency for an illustrative antenna of the type shown in FIGS. 5-8 in accordance with an embodiment.

FIG. 9 is a graph in which antenna efficiency has been plotted as a function of operating frequency F for an illustrative antenna such as antenna 40 of FIGS. 5-8. As shown in FIG. 9, antenna 40 may exhibit resonances in a midband MB and high band HB (coverage in low band LB is not shown for the sake of clarity). As shown in FIG. 9, antenna 40 may have an antenna efficiency characterized by curve 232 in scenarios where ground plane 104 is separated from peripheral conductive structures 16 by distance 140 across the length of slot 101. Antenna 40 may have an antenna efficiency characterized by curve 234 in examples where ground plane 104 includes a distributed capacitance formed by the portion of ground plane 104 that is separated from peripheral conductive structures 16 by distance 142 (as shown in FIGS. 5-8). As shown in FIG. 9, the distributed capacitance formed by the extended portion of the ground plane may improve impedance matching for antenna 40 and thus antenna efficiency relative to scenarios in which the distributed capacitance is absent (i.e., curve 234 is higher than curve 232).

Curve 234 may characterize the performance of antenna 40 when placed in the first and second tuning modes (as shown in FIGS. 6 and 7). Curve 236 may characterize the performance of antenna 40 when placed in the third tuning mode (as shown in FIG. 8). When placed in the third tuning mode, antenna 40 may exhibit improved efficiency in midband MB and high band HB relative to the first and second tuning modes (as shown by curve 234). This increase in antenna efficiency may, for example, be a result of the increase in operating volume available for covering the midband and/or high band in the third antenna tuning mode (e.g., across the conductive loop path shown in FIG. 8) relative to the operating volume available for covering the midband and/or high band in the first and second antenna tuning modes. The frequency response of antenna 40 in the first, second, and third tuning modes may be further tweaked by adjusting components 202 and 208 (e.g., to change the inductance coupled between resonating element arm 108 and ground 104). However, when operated in the third tuning mode, antenna 40 may not exhibit satisfactory antenna efficiency in low band LB (e.g., antenna 40 may cover low band LB in the first and second tuning modes but not in the third tuning mode).

Figure 10:
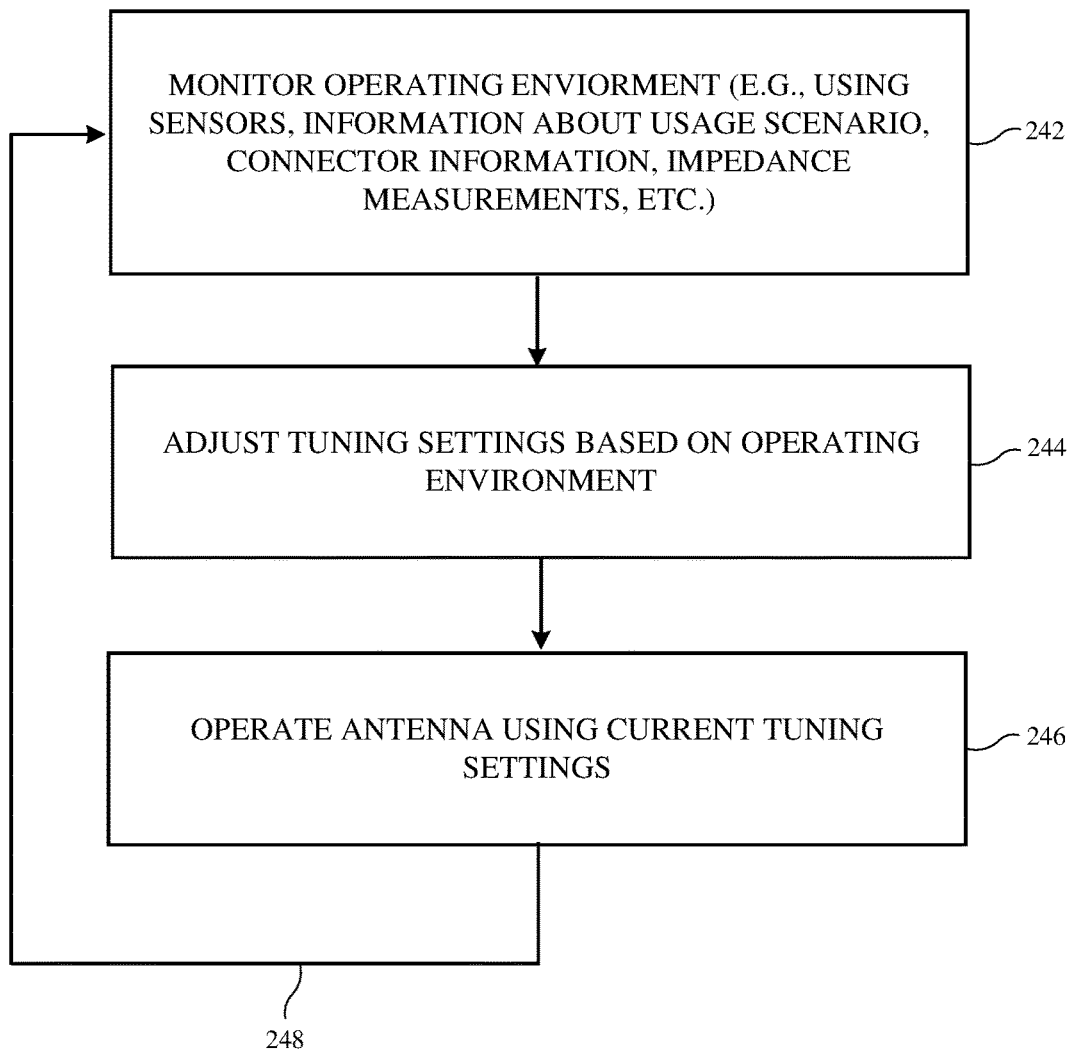
FIG. 10 is a flow chart of illustrative steps that may be involved in operating an electronic device having an antenna of the type shown in FIGS. 5-8 in accordance with an embodiment.

To ensure that antenna 40 operates satisfactorily when the user's right hand is being used to grip device 10 and when the user's left hand is being used to grip device 10 as well as during free space conditions, control circuitry 28 may determine which type of device operating environment is present and may adjust the adjustable circuitry of antenna 40 accordingly to compensate. FIG. 10 is a flow chart of illustrative steps involved in operating device 10 to ensure satisfactory performance for antenna 40 in all desired frequency bands of interest.

At step 242 of FIG. 10, control circuitry 28 may monitor the operating environment of device 10. Control circuitry 28 may, in general, use any suitable type of sensor measurements, wireless signal measurements, operation information, or antenna measurements to determine how device 10 is being used (e.g., to determine the operating environment of device 10). For example, control circuitry 28 may use sensors such as temperature sensors, capacitive proximity sensors, light-based proximity sensors, resistance sensors, force sensors, touch sensors, connector sensors that sense the presence of a connector in a connector port or that detect the presence or absence of data transmission through a connector port, sensors that detect whether wired or wireless headphones are being used with device 10, sensors that identify a type of headphone or accessory device that is being used with device 10 (e.g., sensors that identify an accessory identifier identifying an accessory that is being used with device 10), or other sensors to determine how device 10 is being used. Control circuitry 28 may also use information from an orientation sensor such as an accelerometer in device 10 to help determine whether device 10 is being held in a position characteristic of right hand use or left hand use (or is being operated in free space). Control circuitry 28 may also use information about a usage scenario of device 10 in determining how device 10 is being used (e.g., information identifying whether audio data is being transmitted through ear speaker 26 of FIG. 1, information identifying whether a telephone call is being conducted, information identifying whether a microphone on device 10 is receiving voice signals, etc.).

If desired, an impedance sensor or other sensor may be used in monitoring the impedance of antenna 40 or part of antenna 40. Different antenna loading scenarios may load antenna 40 differently, so impedance measurements may help determine whether device 10 is being gripped by a user's left or right hand or is being operated in free space. Another way in which control circuitry 28 may monitor antenna loading conditions involves making received signal strength measurements on radio-frequency signals being received with antenna 40. In this example, the adjustable circuitry of antenna 40 can be toggled between different settings and an optimum setting for antenna 40 can be identified by choosing a setting that maximizes received signal strength. In general, any desired combinations of one or more of these measurements or other measurements may be processed by control circuitry 28 to identify how device 10 is being used (i.e., to identify the operating environment of device 10).

In a scenario where control circuitry 28 processes orientation information for determining the operating environment of device 10, the orientation information may be gathered using an accelerometer from input-output devices 32 (FIG. 2), for example. The accelerometer may measure a gravity vector having a direction that points towards the earth. Control circuitry 28 may identify the direction of the gravity vector to determine whether device 10 is being held by the user's left or right hand. For example, the gravity vector may have a first component that generally has a positive value when device 10 is being held by the user's left hand and a negative value when device 10 is being held by the user's right hand. Control circuitry 28 may identify the sign of this component of the gravity vector to determine whether device 10 is being held by the user's left or right hand. This is merely illustrative and, in general, any desired sensor data may be used.

At step 244, control circuitry 28 may adjust the configuration of antenna 40 based on the current operating environment of device 10 (e.g., based on data or information gathered while processing step 242). For example, control circuitry 28 may process the data gathered while processing step 242 to determine whether device 10 is being held by the user's right hand, whether device 10 is being held by the user's left hand, or whether device 10 is in some other operating environment (e.g., a free space environment). Control circuitry 28 may determine desired communication bands for antenna 40. As previously discussed, antenna 40 may only be used for midband MB and high band HB communications when the antenna is in the third mode (as shown in FIG. 8). Therefore, in situations where low band LB communication is required of antenna 40, control circuitry 28 may place antenna 40 in the first or second tuning modes. However, if low band communication is not required, control circuitry 28 may place antenna 40 in the third tuning mode (e.g., to optimize antenna efficiency in midband MB and high band HB without susceptibility to the handedness of the user).

If control circuitry 28 determines that device 10 is being held by the user's right hand and low band communication is required, control circuitry 28 may place antenna 40 in the first tuning mode (sometimes referred to as the right hand mode). Control circuitry 28 may place antenna 40 in the first mode by placing tuning components 202 and 208 in a first mode tuning state where all inductors in component 202 are disconnected, as an example. If control circuitry 28 determines that device 10 is being held by the user's left hand and low band communication is required, control circuitry 28 may place antenna 40 in the second mode (sometimes referred to as the left hand mode). Control circuitry 28 may place antenna 40 in the second mode by placing tuning components 202 and 208 in a second tuning state where all inductors in component 208 are disconnected, as an example. If control circuitry 28 determines that low band communications are not required, control circuitry 28 may place antenna 40 in the third mode (sometimes referred to as the reversible mode). Control circuitry 28 may place antenna 40 in the third mode by placing tuning components 202 and 208 in a third tuning state where both components 202 and 208 are used, as an example. By placing antenna 40 in one of these modes, control circuitry 28 may ensure that antenna 40 operates satisfactorily in all frequency bands of interest regardless of how the user is holding device 10.

At step 246, antenna 40 may be used to transmit and receive wireless data in using the currently activated antenna feed and setting for components 202 and 208. This process may be performed continuously, as indicated by line 248.

Figure 11:
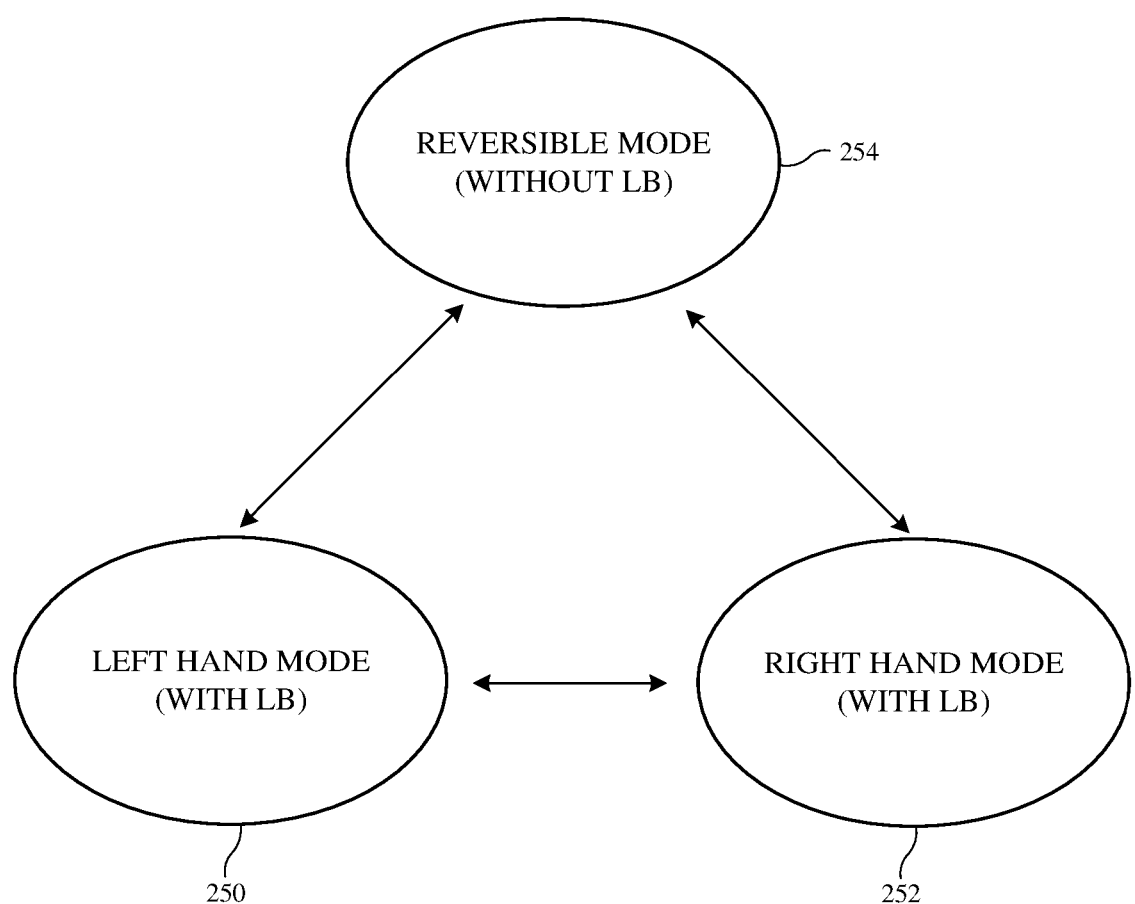
FIG. 11 is a state diagram showing illustrative antenna operating modes for an electronic device with an antenna of the type shown in FIGS. 5-8 in accordance with an embodiment.

A state diagram showing illustrative operating modes for antenna 40 is shown in FIG. 11. As shown in FIG. 11, antenna 40 may be operable in a left hand mode 250 (e.g., the second mode depicted in FIG. 7), a right hand mode 252 (e.g., the first mode depicted in FIG. 6), and a reversible mode 254 (e.g., the third mode depicted in FIG. 8). Control circuitry 28 may identify which mode is to be used based on the monitored operating environment of device 10 (e.g., using the sensor data and other information gathered while processing step 242 of FIG. 10) and may adjust tunable components 202 and 208 of FIG. 5 to place antenna 40 in the corresponding operating mode.

If low band communications are not required, control circuitry 28 may place antenna in the reversible mode 254 (which is resilient to different loading conditions). If low band communications are required, control circuitry 28 may place antenna 40 in mode 250 or mode 252. If it is determined that device 10 is being held in the left hand of a user and low band coverage is required, control circuitry 28 may adjust the circuitry of antenna 40 to place the antenna in left hand mode 250. If it is determined that device 10 is being held in the right hand of a user and low band coverage is required, control circuitry 28 may adjust the circuitry of antenna 40 to place the antenna in right hand mode 252. Control circuitry 28 may disconnect component 202 and use component 208 for tuning in left hand mode 250, may disconnect component 208 and use component 202 for tuning in right hand mode 252, and may use both components 202 and 208 for tuning in reversible mode 254.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
a housing having peripheral conductive housing structures;
an antenna resonating element arm formed from a segment of the peripheral conductive housing structures;
an antenna ground;
an antenna feed having a positive antenna feed terminal coupled to the antenna resonating element arm and a ground antenna feed terminal coupled to the antenna ground;
a first adjustable component coupled between the antenna resonating element arm and the antenna ground on a first side of the antenna feed;
a second adjustable component coupled between the antenna resonating element arm and the antenna ground on a second side of the antenna feed; and
control circuitry configured to adjust the first and second adjustable components between a first tuning mode in which the first adjustable component forms an open circuit between the antenna resonating element arm and the antenna ground and the second adjustable component electrically couples the antenna resonating element arm to the antenna ground, a second tuning mode in which the second adjustable component forms an open circuit between the antenna resonating element arm and the antenna ground and the first adjustable component electrically couples the antenna resonating element arm to the antenna ground, and a third tuning mode in which both the first and second adjustable components electrically couple the antenna resonating element arm to the antenna ground.

2. The electronic device defined in claim 1, wherein the antenna resonating element arm has opposing first and second ends and, while the first and second adjustable components are in the first tuning mode, a first portion of the antenna resonating element arm between the antenna feed and the first end is configured to convey radio-frequency signals in a first frequency band and a second portion of the antenna resonating element arm between the antenna feed and the second end is configured to convey radio-frequency signals in a second frequency band.

3. The electronic device defined in claim 2 wherein, while the first and second adjustable components are in the second tuning mode, a third portion of the antenna resonating element arm between the first adjustable component and the second end of the antenna resonating element arm is configured to convey radio-frequency signals in the first frequency band and a fourth portion of the antenna resonating element arm between the first adjustable component and the first end of the antenna resonating element arm is configured to convey radio-frequency signals in the second frequency band.

4. The electronic device defined in claim 3 wherein, while the first and second adjustable components are in the third tuning mode, a conductive loop path including the first adjustable component, a portion of the antenna ground, the second adjustable component, and a fifth portion of the antenna resonating element arm between the first and second adjustable components is configured to convey radio-frequency signals in the second frequency band and a third frequency band.

5. The electronic device defined in claim 4, further comprising:
first and second dielectric-filled gaps that divide the peripheral conductive housing structures, wherein the first end of the antenna resonating element arm is defined by the first dielectric-filled gap and the second end of the antenna resonating element arm is defined by the second dielectric-filled gap.

6. The electronic device defined in claim 5, wherein the antenna ground includes a first vertical slot that extends beyond an edge of the first dielectric-filled gap, the first vertical slot has edges defined by the antenna ground and the peripheral conductive housing structures, the antenna ground includes a second vertical slot that extends beyond an edge of the second dielectric-filled gap, and the second vertical slot has edges defined by the antenna ground and the peripheral conductive housing structures.

7. The electronic device defined in claim 6 wherein, while the first and second adjustable components are in the first tuning mode, the first vertical slot is configured to convey radio-frequency signals in the third frequency band.

8. The electronic device defined in claim 7, wherein the first frequency band comprises frequencies between 700 MHz and 960 MHz, the second frequency band comprises frequencies between 1710 MHz and 2170 MHz, and the third frequency band comprises frequencies between 2300 MHz and 2700 MHz.

9. The electronic device defined in claim 1, wherein the first adjustable component comprises at least one inductor and switching circuitry that selectively couples the at least one inductor between the antenna resonating element arm to the antenna ground.

10. The electronic device defined in claim 9, wherein the second adjustable component comprises at least one inductor and switching circuitry that selectively couples the at least one inductor between the antenna resonating element arm to the antenna ground.

11. The electronic device defined in claim 1, further comprising:
a display, wherein the antenna ground comprises conductive portions of the display.

12. The electronic device defined in claim 1, further comprising:
a transmission line coupled to the antenna feed, wherein a distributed capacitance is formed between the antenna ground and the antenna resonating element arm that impedance matches the antenna resonating element arm to the transmission line.

13. An electronic device, comprising:
a housing having peripheral conductive structures;
an antenna resonating element arm formed from a segment of the peripheral conductive structures that extends between first and second dielectric-filled gaps in the peripheral conductive structures;
an antenna ground;
an antenna feed having a positive antenna feed terminal coupled to the antenna resonating element arm and a ground antenna feed terminal coupled to the antenna ground;
a first antenna tuning component coupled between a first location on the antenna resonating element arm and the antenna ground; and
a second antenna tuning component coupled between a second location on the antenna resonating element arm and the antenna ground, wherein the positive antenna feed terminal is interposed between the first and second locations, a first portion of the antenna resonating element arm extending between the first dielectric-filled gap and the positive antenna feed terminal is configured to convey radio-frequency signals in a given frequency band while the first and second antenna tuning components are placed in a first tuning mode, a second portion of the antenna resonating element arm extending between the second location and the second dielectric-filled gap is configured to convey radio-frequency signals in the given frequency band while the first and second antenna tuning components are placed in a second tuning mode, and a third portion of the antenna resonating element arm extending between the first and second locations is configured to convey radio-frequency signals in the given frequency band while the first and second antenna tuning components are placed in a third tuning mode.

14. The electronic device defined in claim 13, further comprising:
control circuitry configured to place the first and second antenna tuning components in a selected one of the first tuning mode, the second tuning mode, and the third tuning mode.

15. The electronic device defined in claim 14, wherein the given frequency band is a first frequency band and a fourth portion of the antenna resonating element arm extending between the positive antenna feed terminal and the second dielectric-filled gap is configured to convey radio-frequency signals in a second frequency band that is lower than the first frequency band while the first and second antenna tuning components are placed in the first tuning mode.

16. The electronic device defined in claim 15, wherein a fifth portion of the antenna resonating element arm extending between the second location and the first dielectric-filled gap is configured to convey radio-frequency signals in the second frequency band while the first and second antenna tuning components are placed in the second tuning mode.

17. The electronic device defined in claim 16, wherein the electronic device does not transmit radio-frequency signals in the second frequency band using the antenna resonating element arm while the first and second antenna tuning components are placed in the third tuning mode.

18. An electronic device comprising:
an antenna resonating element arm;
an antenna ground;
an antenna feed having a positive antenna feed terminal coupled to the antenna resonating element arm and a ground antenna feed terminal coupled to the antenna ground;
a first antenna tuning component coupled between a first location on the antenna resonating element arm and the antenna ground;
a second antenna tuning component coupled between a second location on the antenna resonating element arm and the antenna ground; and
control circuitry configured to adjust the first and second antenna tuning components between a first tuning mode in which the first antenna tuning component, a portion of the antenna ground, the second antenna tuning component, and a portion of the antenna resonating element arm are configured to resonate in a given frequency band and a second tuning mode in which the first antenna tuning component forms an open circuit between the antenna resonating element arm and the antenna ground.

19. The electronic device defined in claim 18, wherein the first and second antenna tuning components are both electrically connected between the antenna resonating element arm and the antenna ground in the first tuning mode.

20. The electronic device defined in claim 18, wherein the first antenna tuning component comprises first and second inductors coupled in parallel between the first location on the antenna resonating element arm and the antenna ground and switching circuitry configured to selectively couple the first and second inductors between the antenna resonating element arm and the antenna ground and the second antenna tuning component comprises third and fourth inductors coupled in parallel between the second location on the antenna resonating element arm and the antenna ground and switching circuitry configured to selectively couple the third and fourth inductors between the antenna resonating element arm and the antenna ground.

* * * * *